(12) United States Patent
Catthoor et al.

(10) Patent No.: US 10,802,743 B2
(45) Date of Patent: Oct. 13, 2020

(54) CONTROL PLANE ORGANIZATION FOR FLEXIBLE DIGITAL DATA PLANE

(71) Applicants: IMEC vzw, Leuven (BE); Katholieke Universiteit Leuven, Leuven (BE)

(72) Inventors: Francky Catthoor, Temse (BE); Praveen Raghavan, Los Gatos, CA (US); Daniele Garbin, Leuven (BE); Dimitrios Rodopoulos, Leuven (BE); Odysseas Zografos, Leuven (BE)

(73) Assignees: IMEC vzw, Leuven (BE); Katholieke Universiteit Leuven, Leuven (BE)

(*) Notice: Subject to any disclaimer, the term of this patent is extended or adjusted under 35 U.S.C. 154(b) by 0 days.

(21) Appl. No.: 16/028,328

(22) Filed: Jul. 5, 2018

(65) Prior Publication Data
US 2019/0034111 A1    Jan. 31, 2019

(30) Foreign Application Priority Data

Jul. 19, 2017   (EP) .................................... 17182232

(51) Int. Cl.
*G06F 12/00*    (2006.01)
*G06F 3/06*     (2006.01)
(Continued)

(52) U.S. Cl.
CPC .......... *G06F 3/0646* (2013.01); *G06F 3/0604* (2013.01); *G06F 3/0673* (2013.01);
(Continued)

(58) Field of Classification Search
CPC .... G06F 3/0646; G06F 3/0673; G06F 3/0604; G06N 3/0445; G06N 3/0454;
(Continued)

(56) References Cited

U.S. PATENT DOCUMENTS 4,899,307 A    2/1990  Lenoski
5,142,494 A    8/1992  D'Luna
(Continued)

FOREIGN PATENT DOCUMENTS

EP    1 958 059 A2    8/2008
EP    1 958 059 B1    11/2009
(Continued)

OTHER PUBLICATIONS

Hu et al., "Hardware realization of BSB recall function using memristor crossbar arrays," DAC Design Automation Conference (Jun. 3-7, 2012) pp. 498-503.
(Continued)

*Primary Examiner* — Mardochee Chery
(74) *Attorney, Agent, or Firm* — Knobbe, Martens, Olson & Bear, LLP

(57) ABSTRACT

A control plane for controlling transfer of data to a data plane is disclosed. In one aspect, the control plane comprises memory cells for storing a digitally coded parameter value and having a data input electrode, a data output electrode and a control electrode, n data input terminals that receive a data input value and apply it to the data input electrode of an associated memory cell, and n data output terminals coupled to a data output electrode of an associated memory cell. The control plane further comprise a first delay line having delay elements and arranged for receiving a stream of control bit values, and a second delay line having delay elements and arranged for receiving a signal for enabling the control bit values in the first delay line, wherein data is transferred in a controlled and synchronized fashion to an output electrode.

20 Claims, 15 Drawing Sheets

(51) Int. Cl.
G11C 16/04 (2006.01)
G11C 13/00 (2006.01)
G11C 7/10 (2006.01)
G06N 3/063 (2006.01)
G11C 17/16 (2006.01)
G11C 11/54 (2006.01)
G06N 3/04 (2006.01)
G06N 3/08 (2006.01)

(52) U.S. Cl.
CPC ......... G06N 3/0445 (2013.01); G06N 3/0454 (2013.01); G06N 3/063 (2013.01); G06N 3/08 (2013.01); G11C 7/1006 (2013.01); G11C 11/54 (2013.01); G11C 13/0002 (2013.01); G11C 13/0061 (2013.01); G11C 16/04 (2013.01); G11C 17/165 (2013.01); G06N 3/088 (2013.01); G11C 2213/71 (2013.01)

(58) Field of Classification Search
CPC .......... G06N 3/063; G06N 3/08; G06N 3/088; G11C 13/0061; G11C 11/54; G11C 17/165; G11C 7/1006; G11C 13/0002; G11C 16/04; G11C 2213/71
USPC ........................................................ 711/154
See application file for complete search history.

(56) References Cited

U.S. PATENT DOCUMENTS 5,901,092 A 5/1999 Tran
2015/0058268 A1 2/2015 Modha

FOREIGN PATENT DOCUMENTS

EP 2 230 633 A1 9/2010
EP 3 093 995 A1 11/2016
EP 3 144 820 A1 3/2017

OTHER PUBLICATIONS

Hu et al., "Dot-product engine for neuromorphic computing: Programming 1T1M crossbar to accelerate matric-vector multiplication," published in 2016 53rd ACM/EDAC/IEEE Design Automation Conference (DAC).

Yu, Shimeng (ed.) "Neuro-inspired Computing Using Resistive Synaptic Devices," (2017) Chapters 1, 9, and 12, © Springer International Publishing AG 2017, DOI 10.1007/978-3-319-54313-0_9.

Extended European Search Report dated Nov. 20, 2018 for European Patent Application No. EP 18 166 423, which corresponds to subject U.S. Appl. No. 16/028,328.

Burleson, et al, Wave-Pipelining: A Tutorial and Research Survey, IEEE Transactions on Very Large Scale Integration (VLSO) Systems, vol. 6, No. 3, Sep. 1998.

Fukase, et al., Exploring Design and Testing Methods of High Speed Power Conscious Wave-Pipelines, Department of Electronic and Information Systems Engineering Computer Network Systems Center, Hirosake University, Hirosake, Japan.

Furber, et al., The SpiNNaker Project, Proceedings of the IEEE, vol. 102, No. 5, May 2014.

Garbin et al. Variability-tolerant Convolutional Neural Network for Pattern Recognition Applications based on OxRAM Synapses.

Park et al. Neuromorphic Speech Systems using Advanced ReRAM-based Synapse.

Burr et al. Experimental Demonstration and Tolerancing of a Large-Scale Neural Network (165000 Synapses) Using Phase-Change Memory as the Synaptic Weight Element, IEEE Transactions on Electron Devices, vol. 62, No. 11, Nov. 2015.

Roy et al. Brain-Inspired Computing with Spin Torque Devices.

Merolla et al. A Million Spiking-Neuron Integrated Circuit with a Scalable Communication Network and Interface, Science 345, 668, 2014.

Moradi et al. A Memory-Efficient Routing Method for Large-Scale Spiking Neural Networks.

CONTROL PLANE ORGANIZATION FOR FLEXIBLE DIGITAL DATA PLANE

CROSS-REFERENCE TO RELATED APPLICATIONS

This application claims foreign priority to EP 17182232.3, filed on Jul. 19, 2017, the contents of which is incorporated by reference herein in its entirety.

BACKGROUND

Technological Field

The disclosed technology is generally related to the field of control plane realizations for a digital data and signal processing unit.

Description of the Related Technology

Many present-day digital data and signal processing applications are implemented on a platform where data or signals have to be transferred (for later processing) or have to be communicated. The hardware responsible for this data transfer will in general contain a control plane and a data plane. This is true for several important domains, such as, but not limited to, machine learning, neuromorphic processing, and digital multimedia processing (e.g., digital filtering).

Modern machine learning is in many cases based on so-called convolutional neural networks (CNNs) or deep-learning neural networks (DNNs). The convolution engines that are at the heart of these algorithms are a major focus of the disclosed technology. Neuromorphic architectures are typically based on other concepts, mostly spiking based. Important examples are spiking neural networks (SNN), liquid state machines (LSM) etc. The data planes of these machine learning and neuromorphic architecture approaches contain a regular structure of memory cells which contain the parametric weights. These are called the local arrays. They are addressed by a parameter learning or updating organization located outside the storage structure. Current neural algorithms and the corresponding neuromorphic platforms focus mostly on the local arrays and they nearly always use a 2-dimensional array structure for that, connecting the input and output layer of neurons. In most neural algorithms, such local arrays also need to communicate with each other through an inter-array communication network, which is called the inter-array communication network. Also in the more general case of data transfer in a digital data and signal processing unit, such local clusters of processing units (also called local arrays in this description) can be identified. And also these are communicating with each other through an inter-array communication network. It is to be noted that, for multi-dimensional signal processing like, e.g., digital filters, the data plane contains multiply-accumulate units where the filter coefficients have to be multiplied with the input signal streams. In that case the multiply-accumulate units are the local arrays and the filter coefficients correspond to the parameters. The infrequent updating of these coefficients is then organized by the control plane. The present-day inter-array communication network solutions are based on different types of busses (shared or not) and networks-on-chip (NoC).

Neuromorphic systems, also referred to as artificial neural networks, are computational systems so configured that electronic systems wherein they are provided, can essentially function in a manner that more or less imitates the behaviour of networks of biological neurons. Still, in some cases the link to the biological neurons is mostly lost, like in the case of so-called convolutional neural networks (CNNs) or deep-learning neural networks (DNNs). Neuromorphic computation does not generally utilize the traditional digital model of manipulating zeros and ones. In order to allow communication between potentially strongly connected neurons in such neural networks, connections are created between processing elements which are roughly functionally equivalent to neurons of a biological brain. Neuromorphic computation may comprise various electronic circuits that are modelled on biological neurons and synapses. Typically multi-layer neural networks are used, with one or more hidden layers (or in general intermediate layers if non-standard neural network topologies would be used). Some well-known examples include perceptrons (including multi-layer perceptrons or MLPs), convolutional neural networks (CNNs), asynchronous conceptors, restricted Boltzmann machines (RBMs), liquid state machines (LSM), long-short term memory networks (LSTM), and deep-learning neural networks (DNNs). In particular implementations, synaptic plasticity/adaptation is crucial. The neural network topologies can use synchronous or asynchronous signalling protocols. Because of the strong resemblance to how a human brain works, the asynchronous spike-timing-dependent plasticity (STDP) spiking protocol is very popular in the neuromorphic community. Neuron layers in principle should be "fully" connected with one another to allow all connection flexibility, which leads to a densely connected neural array, for example in particular embodiments with $N_1 \times M_1$ synapses for $N_1$ neurons in the input layer and $M_1$ neurons in the output layer of the stage. However, typically also at least one so-called hidden neuron layer is present with $K_1$ neurons. In general it can also be $N_1 \times K_1 \times M_1$, as shown in FIG. 1, when $N_1$ neurons are present in the input layer and $M_1$ neurons are present in the output layer. Across stages, the neuron layers also need to communicate, but not all connections then need to be present, so no full crossbar is then needed anymore. That is partly the case already between the input and output layer when also a hidden layer is present (see FIG. 1 where not all possible connections are realizable between the $N_1$ input neurons and $M_1$ output neurons, except when $K_1 = N_1 \times M_1$, which would lead to too much cost overhead). That is especially so when several clusters of densely connected neural arrays (in literature also referred to as stages) are communicating with each other (see FIG. 2 where two clusters are shown with their mutual $L_1$ connections that form a subset of all possible connections). However, upfront at fabrication time it is not known which specific neuron connections (which of the $L_1$ connections in FIG. 2) will be needed later. Moreover, building a neuromorphic system comprising only one single dense neural cluster clearly does not scale in terms of connections. Hence, there clearly is a big challenge in finding the best inter-array communication network approach across the clusters, supported with an appropriately matched communication network architecture.

It should be stressed, again, that the above representation with multiple arrays or stages of densely connected neuron connections is valid for all the different neural algorithm and machine learning paradigms mentioned above, both of the spiking type (like MLP, SNN, LSM) and the non-spiking machine learning type (like CNN, LSTM and DNN).

Looking into more detail at the local arrays and inter-array communication networks, as formulated above, there is a need for scalable solutions which provide a broad applicability. This scalability has been the focus of EP3144820. In addition it is important to have a low energy and low leakage implementation of the switches for the inter-array communication networks. This has been the focus of EP3093995.

In addition to these data plane aspects of the local arrays and inter-array communication networks, also the control plane should be efficiently implemented. Also here the reduced area, energy and delay are desired figures-of-merit.

Some prior art approaches to solve the combined data/control plane issues with reasonable cost while still covering a (very) wide application range, are now discussed with more technical details. Existing solutions can roughly be divided into a number of categories.

A first category of solutions is characterized by a limited connectivity. Rather regular locally connected architectures are usually used in this approach, similar to systolic arrays. These are then time-multiplexed with a bus communication in between the spatially replicated arrays. Two main options are available for time-multiplexing: Local Sequential Global Parallel (LSGP) or the opposite Local Parallel Global Sequential (LPGS). Initially these are formulated for a single stage, but this can be generalized to multiple stages. The SpiNNaker project of the University of Manchester (Furber, S. B. et al., 2014. The SpiNNaker project. *Proceedings of the IEEE*, 102(5), pp. 652-665) is, e.g., mostly based on this with heavy time multiplexing, restricting global data connections. Several memory cell types may be utilized for the data plane: for instance SRAM (like the SpiNNaker approach), O×RAM (like the CEA-LETI approach; D. Garbin et al., "Variability-tolerant Convolutional Neural Network for Pattern Recognition applications based on O×RAM synapses," 2014 IEEE International Electron Devices Meeting, San Francisco, Calif., 2014, pp. 28.4.1-28.4.4), PCMO (like the Pohang Univ approach—Park, S., et al. "Neuromorphic speech systems using advanced ReRAM-based synapse." Electron Devices Meeting (IEDM), 2013 IEEE International. IEEE, 2013.), PCM (like the alternative IBM approach—G. W. Burr et al., "Experimental demonstration and tolerancing of a large-scale neural network (165,000 synapses), using phase-change memory as the synaptic weight element," 2014 IEEE International Electron Devices Meeting, San Francisco, Calif., 2014, pp. 29.5.1-29.5.4), STT-MRAM (like the Purdue, K. Roy approach—K. Roy, M. Sharad, D. Fan and K. Yogendra, "Brain-inspired computing with spin torque devices," 2014 Design, Automation & Test in Europe Conference & Exhibition (DATE), Dresden, 2014, pp. 1-6.

The control plane for these local arrays is typically organized in a fully parallel way: each parameter, e.g., weight, can be individually addressed and controlled by a grid of horizontal and vertical wires. This allows quite some flexibility but also causes much internal and especially external area and energy overhead in the memory structure. It typically requires large decoders, for instance.

On the other hand, for the inter-array communication networks, heavily shared buses are used which require less control overhead, but due to the heavy time multiplexing they create access bandwidth limitations for the neural algorithms to be executed on them.

In conclusion, in the first category of solutions, compromises are made, either on area and energy cost, or on flexibility.

In a second category of known solutions, full connectivity is maintained. Connections inside the local arrays are realized then in a more "static" way. One then still has to take care that interconnections are not too long though by, e.g., limiting the array size. But then the inter-array communication still has to be taken care of. This creates a first sub-branch of solutions. A second, alternative, sub-branch is obtained if one opts for a more dynamic architectural solution. These two new sub-branches are further discussed below.

The first sub-branch comprises solutions with static full connectivity. Multi-stage networks have some form of crossbar implementation. These still require a huge area and energy overhead for large N involving $N^2$ transfers. A partial solution exists in power-gating all connections not required during the actual running of an application instance, in this way restricting the overall energy. Then still the same area is required and consequently, still a strong energy overhead remains in scaled technology nodes due to the needlessly long lines in the oversized layout. The TrueNorth project (Merolla, P. A.; Arthur, J. V.; Alvarez-Icaza, R.; Cassidy, A. S.; Sawada, J.; Akopyan, F.; Jackson, B. L.; Imam, N.; Guo, C.; Nakamura, Y.; Brezzo, B.; Vo, I.; Esser, S. K.; Appuswamy, R.; Taba, B.; Amir, A.; Flickner, M. D.; Risk, W. P.; Manohar, R.; Modha, D. S. (2014). "A million spiking-neuron integrated circuit with a scalable communication network and interface". Science. 345 (6197): 668) uses this approach. However, this solution is still not attractive due to the lack of full scalability and of sufficient parallelism. It requires a huge energy budget, so it is not suited for embedded portable usage, only for 'shared servers in the cloud'. Also then it is only for server farms with a large power plant, so preferably not for distributed warehouse servers, which have to be plugged into the local power supply.

Solutions in the second sub-branch have dynamic full connectivity. They exploit the fact that longer inter-cluster connections are needed more rarely. It is not known upfront where these connections are situated though, so a run-time layer is needed to accommodate the actual transfers at instantiation time. One way to achieve dynamic full connectivity is to exploit hardware based control protocols using some type of statically allocated Network-on-Chip (NoC) or multi-stage network approach. This approach is adopted, e.g., in the paper "*A Memory-Efficient Routing Method for Large-Scale Spiking Neural Networks*" (S. Moradi et al., Eur. Conf. on Circuit Theory and Design (ECCTD) 2013, September. 2013, pp. 1-4). A Local Parallel Global Sequential (LPGS) solution is used there to obtain a parallel implementation of a quite strongly connected "static" intra-cluster organization and a largely sequential (time-multiplexed) implementation of more sparsely connected time-varying inter-cluster communication.

US2015/058268 (IBM) presents a hierarchical, scalable neuromorphic synaptronic system for synaptic and structural plasticity. However, the obtained scalability is limited, e.g., as local connections are performed with "sparse crossbar tables"; however, that does not allow realizing global connections in a fully flexible way. The system is still dimensioned at design time. Further, the solution proposed, here, does not achieve scalability and low power simultaneously.

All of these data plane solutions require a control plane. Because of their strong spatial distribution and reduced time multiplexing they provide more flexibility for the synapse communication. However, this comes always at a cost of larger area and energy overhead for the control plane. Many parallel long wires need to be distributed across the large spatially distributed data plane floorplan. Hence, there is a need for alleviating this control plane overhead encountered both in local arrays and global synapse communication networks connecting a plurality of such local arrays.

SUMMARY OF CERTAIN INVENTIVE ASPECTS

It is an objective of the disclosed technology to provide a low-cost low-energy control plane for a neuromorphic platform.

The above and other objectives are accomplished by the solution according to embodiments of the disclosed technology.

Embodiments of the disclosed technology provide a method for designing a control plane which is flexible enough to support many different neural algorithms on a given neuromorphic data plane. At the same time, the control plane also allows reducing the area and energy overhead while maintaining scalability and the possibility to implement dynamic connectivity. Particular embodiments of the disclosed technology provide a control plane circuit implementation based on TFT devices with such features. Embodiments of the disclosed technology also provide a method for operating such a control plane.

It is an advantage of embodiments of the disclosed technology that they provide a low cost implementation for controlling a synapse communication network.

In a first aspect, the disclosed technology provides a control plane for controlling transfer of data to a data plane. Here, for example, an example control plane may comprise:
  a number n of at least two memory cells for each storing a digitally coded parameter value, each memory cell having a data input electrode, a data output electrode and a control electrode;
  n data input terminals for each receiving a data input value and applying it to the data input electrode of an associated memory cell to which the data input terminal is coupled, and
  n data output terminals, each coupled to a data output electrode of an associated memory cell.

Such control plane may further comprise a first delay line comprising n or n−1 first delay elements. The first delay line is arranged for receiving a stream of control bit values, each first delay element controlling, based on its current control bit value, by means of an access control device, the transfer of data received by a memory cell via its associated data input electrode to its associated data output electrode, thereby combining the data input value with the digitally coded parameter value stored in this associated memory cell. The parameter values may for example be weight values, such that weight control comes in sequentially rather than in parallel as in prior art. The control plane furthermore comprises a second delay line comprising n or n−1 second delay elements. The second delay line is arranged for receiving an enabling signal for enabling the control bit values of the stream of control bit values in the first delay line to be passed to the control electrode of the associated memory cells such that, when data appears at the data input electrode associated with a particular memory cell, it is transferred in a controlled and synchronized fashion to the associated output electrode, depending on the stream of control bit values and the enabling signal.

Delay line elements are ordered in the first and second delay line, respectively. Each delay line has a first, second, third, etc. delay element. In a control plane according to embodiments of the disclosed technology, each corresponding element of the first delay line and the second delay line (e.g., $n^{th}$ delay element of the first delay line and $n^{th}$ delay element of the second delay line; or $n^{th}$ delay element of the first delay line and $(n-1)^{th}$ delay element of the second delay line if the second delay line would not start with a delay element, while the first delay line would do so; or vice versa) have a pairwise matched delay. Corresponding delay elements of the two delay lines are delay elements which form part of a same stage in the control plane, i.e., are associated with a same memory cell.

In a control plane according to embodiments of the disclosed technology, the first delay line has a first delay, and the second delay line has a second delay, matched to a fixed ratio, whereby the value of the second delay is substantially twice the value of the first delay. This way, synchronization between slices is not lost. The degree of matching depends on the frequency of changing signals: if the changing is slow, the matching can be less strict. Synchronization does not need to be clocked, but it can also be, e.g., wave pipelining based.

In a control plane according to embodiments of the disclosed technology, the memory cells may be implemented as TFT devices.

In a control plane according to embodiments of the disclosed technology, the at least two data output terminals may be connected to a common node, the at least two data output terminals each receiving a combination, e.g., product, of the value stored in the memory cell and the data input value applied to this memory cell. This way, a wired OR may be implemented. The combined data is stored on a node. Detection of the stored value is possible as long as the node keeps its charge and potential. For slow detection this means only high impedances may be connected to this node in order to preserve the charge on the node to allow proper detection.

A control plane according to embodiments of the disclosed technology may further comprise an output wire for delivering to an output node a sum of products of values stored in the memory cells and data input values applied to the corresponding memory cell.

In particular embodiments, the synchronization in the first and/or second delay lines may be achieved by means of a global clock signal. Typically, however, such clocking is avoided as it consumes much power.

In embodiments of the disclosed technology, the first and/or second delay lines may include a wave pipeline sequentially steered shared control line for taking care of the synchronization between both.

In embodiments of the disclosed technology, the enabling signal may have a single pulse.

In a control plane according to embodiments of the disclosed technology, the memory cells may be implemented with 2D material devices such as for instance, without the disclosed technology being limited thereto, devices based on WSe2, graphene, or MoS2.

In a control plane according to embodiments of the disclosed technology, the memory cells may be based on transistors.

In a control plane according to embodiments of the disclosed technology, the memory cells may comprise low-leakage devices. The memory cells may for instance be implemented as TFT, such as for instance GIZO devices.

In a control plane according to embodiments of the disclosed technology, the storing of the value may be done by any of weighted geometrical coding (e.g., factorisation—such as geometrical binary coding or gate area scaling), current scaling, transistor threshold voltage scaling, accumulation period scaling (e.g., by changing the duration of the enabling signal).

In a control plane according to embodiments of the disclosed technology, the memory devices may be implemented in 3D BEOL stacking technology.

Embodiments of the disclosed technology also include the use of a control plane according to embodiments of the first aspect, wherein the enabling signal has a single pulse. A pulse is needed for every consecutive rewriting of the digitally coded parameter value.

In a second aspect, the disclosed technology provides a neural network or neuromorphic computing platform implementing a control plane according to any of the embodiments of the first aspect, with data plane interaction.

In a third aspect, the disclosed technology provides a method for machine learning making use of the control plane according to any of the embodiments of the first aspect, with data plane interaction.

For purposes of summarizing the disclosed technology and the advantages achieved over the prior art, certain objectives and advantages of the disclosed technology have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

The above and other aspects of the disclosed technology will be apparent from and elucidated with reference to the embodiment(s) described hereinafter.

BRIEF DESCRIPTION OF THE DRAWINGS

The disclosed technology will now be described further, by way of example, with reference to the accompanying drawings, wherein like reference numerals refer to like elements in the various figures.

DETAILED DESCRIPTION OF CERTAIN ILLUSTRATIVE EMBODIMENTS

Figure 1:
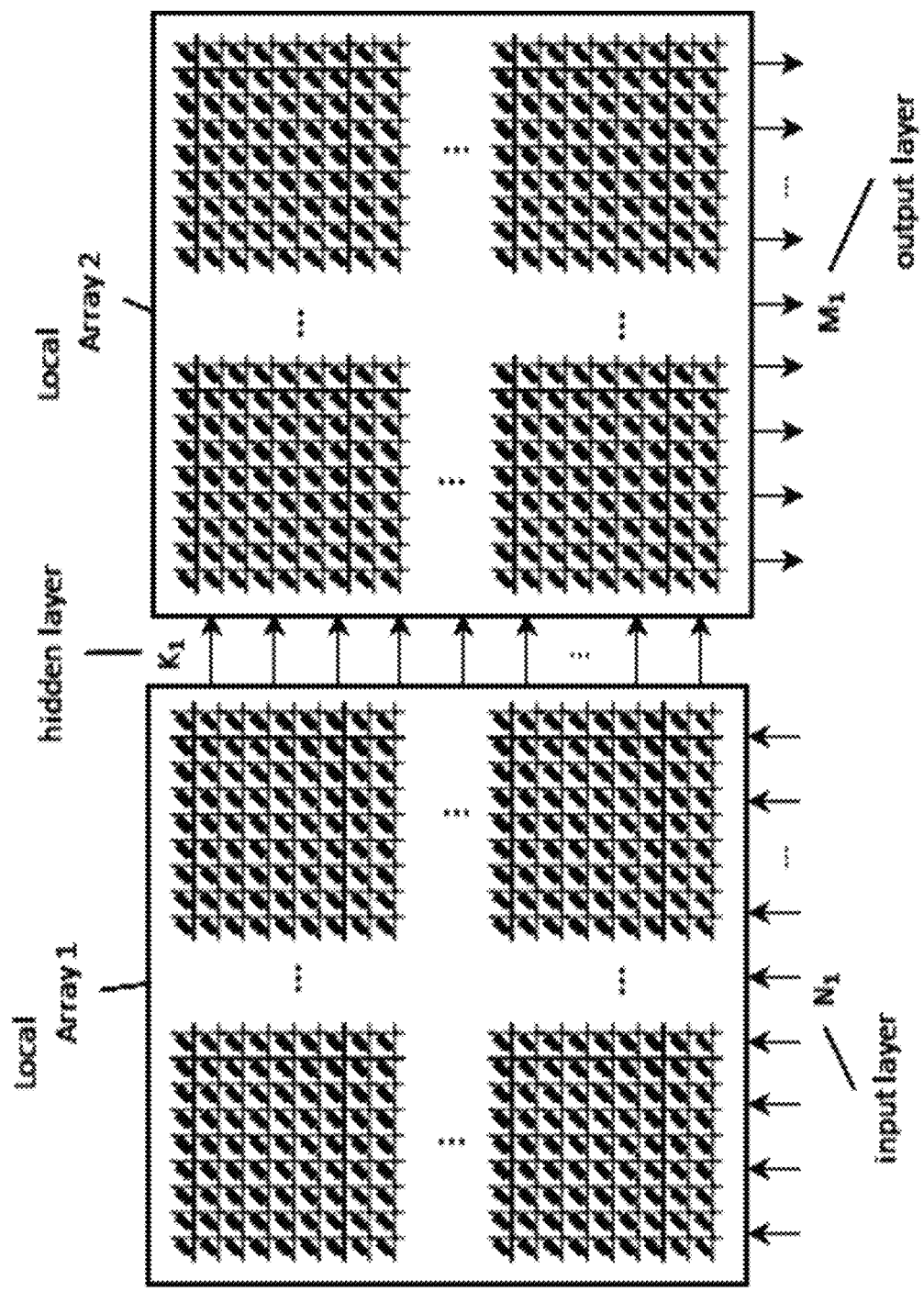
FIG. 1 illustrates a conventional neural network stage with three neuron arrays (input, output and hidden layers) and two dense local arrays.

The disclosed technology will be described with respect to particular embodiments and with reference to certain drawings but the disclosed technology is not limited thereto.

In this text, the main illustrations will come from the machine learning and neuromorphic domains, but the disclosed technology is not limited to these and can also be implemented in other domains, such as, e.g., digital multimedia processing (e.g., digital filtering).

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

In the context of the disclosed technology, the data plane is the conceptual realization of transfer and processing of data between at least one data input and at least one data output. The detailed architectural and circuit implementation is irrelevant for the scope of this patent, and it can include a.o. datapaths, FIFO buffers, switches such as crossbar switches, etc.

The control plane is the conceptual realization of the way the data plane is controlled. Here, however, we do focus also on the detailed architectural and circuit implementation (i.e., the control structure), which will be disclosed in more detail hereinafter.

As an illustrative example, machine learning is dealt with hereinafter, without being intended to be limiting for the disclosed technology. Another important domain, but also not intended to be limiting, is neuromorphic engineering, for example spiking neural networks.

Neuromorphic engineering tries to emulate the structure and function of the nervous system, to better understand the brain and/or to design more intelligent machines. Hereto, the similarity between semiconductor physics and electrophysiology is relied on, and the electrical characteristics of neurons and synapses are mimicked in CMOS. In neuromorphic computing, neurons and synapses behave as distributed processors and storage devices.

Current neuromorphic platforms focus mostly on the local array and they nearly always use a 2-dimensional array structure for that, connecting an input and output layer of neurons (1-dimensional). In the state-of-the-art these local array organizations are not sufficiently optimized for energy and cost. They use costly non-volatile memory technologies that incur a large non-recurring engineering (NRE) fabrication cost. Moreover, they are not truly scalable towards a 3D integration because multiple memory layers require costly fabrication options again.

In contrast, in embodiments of the disclosed technology high impedance devices, hence devices with low leakage current, e.g., below $10^{-8}$ A, are used. When combined with a control device, these devices have a storage facility on their gate where charges can be stored. These devices can for example be microelectronic transistor devices. In particular embodiments, advantage can be taken of cheaply fabricated TFT technologies, and these are integrated in the BEOL. The parametric weight storage for both the local array and the inter-array communication network is obtained by storing a charge on the gate of a TFT device, which is isolated from leaking away by a second TFT device. The latter is enabled by the near-zero leakage, e.g., with a leakage current below $10^{-8}$ A, of the TFT devices. In embodiments of the disclosed technology, the charge can be coded in a binary way similarly to the geometrically factorized parameters, in an incremental way, or in any other suitable way. It can also be accumulated across all the active parameters connected to an output neuron and read out by a single shared sense amplifier. These optimizations enable additional cost and energy advantages compared to STT-MRAM/PCM solutions (which cannot be accumulated across synapses for a neuron) or VMCO or PCMO/OxRAM solutions (where the number of binary levels are very reduced). The control of this network organization can be achieved by a wave pipelined based shared delay line to further reduce the cost overhead. The area of a single TFT device is expected to be scalable to 30-45 nm which is not extremely dense. But, because the technology is very cheap and the devices are integrated between the metal layers in the BEOL stack, this is not seen as a real issue for many applications especially when they are cost rather than performance-oriented. In addition, these devices are relatively slow (tens to hundreds of nsec). However, because of the dominant parameter storage in neuromorphic platforms, time multiplexing has a relatively high overhead and hence a smaller benefit than traditional microprocessor platforms. And the sample rate of practical neural algorithm applications does not require speeds beyond the μsec (micro second) periods. So also that disadvantage is in practice not really an issue in most applications. Only the neurons have to be integrated in the bottom-layer FEOL. All the synapses are stacked on top in a potentially huge monolithic 3D BEOL stack. When the number of metal BEOL layers would need to become too high for the size of the overall neuromorphic platform, TSV technology allows further stacking dies in a so-called 3D SoC.

Figure 3:
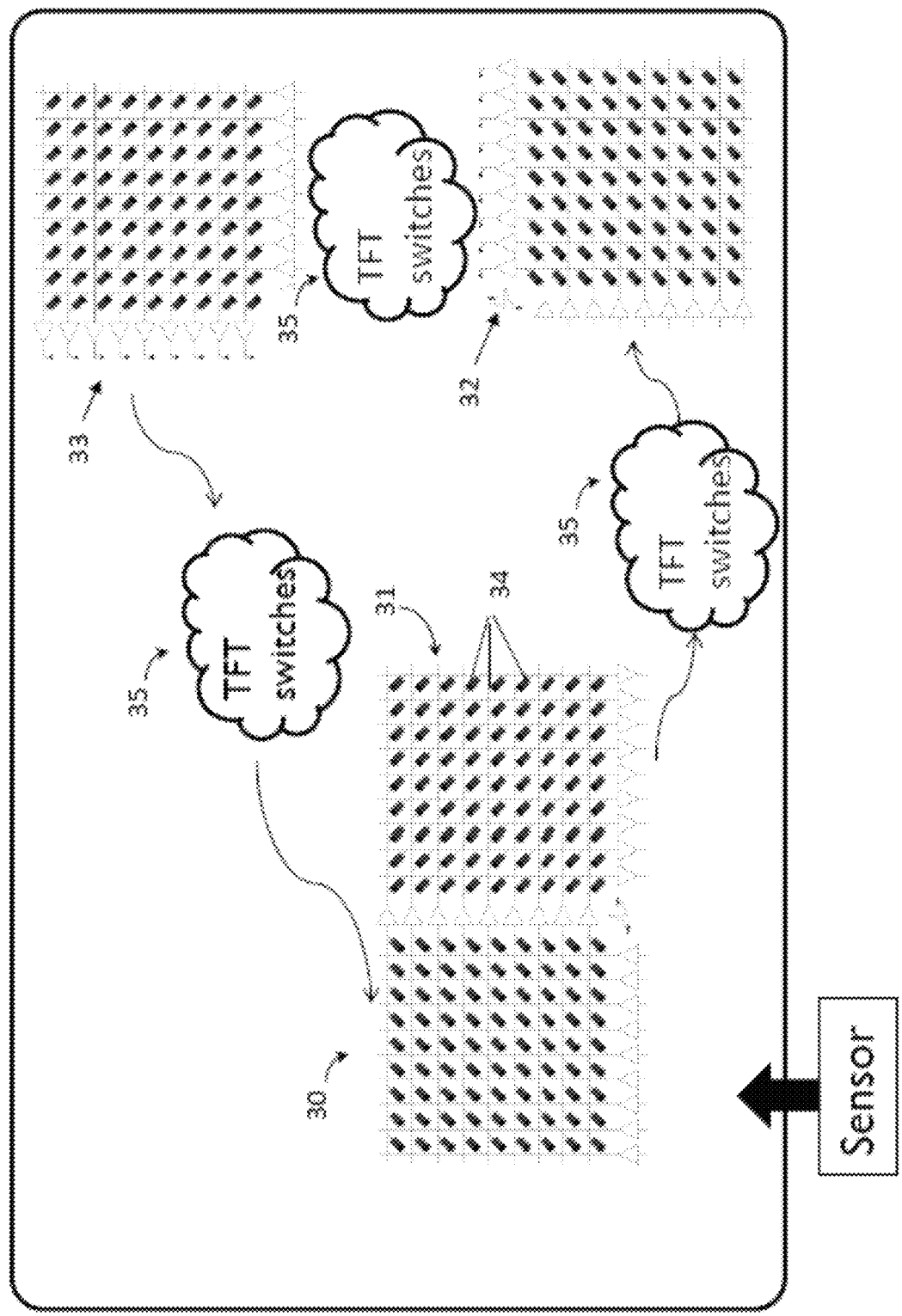
FIG. 3 is a high level illustration of a particular type of neuromorphic network (implementing TFT switches for the inter-array communication) according to embodiments of the disclosed technology.

The overall organization of a data plane template is shown in FIG. 3. Parameters are memorized in arrays 30, 31, 32 of memory cells 34. During processing, a 1-dimensional neuron is manipulated by 2-dimensional weighting by means of the parameters, typically in a vector-matrix multiplication. Thus a connection network 35 is required, which needs switching means controlled by a control plane. Arrays storing parameters are inherently limited in size.

Figure 2:
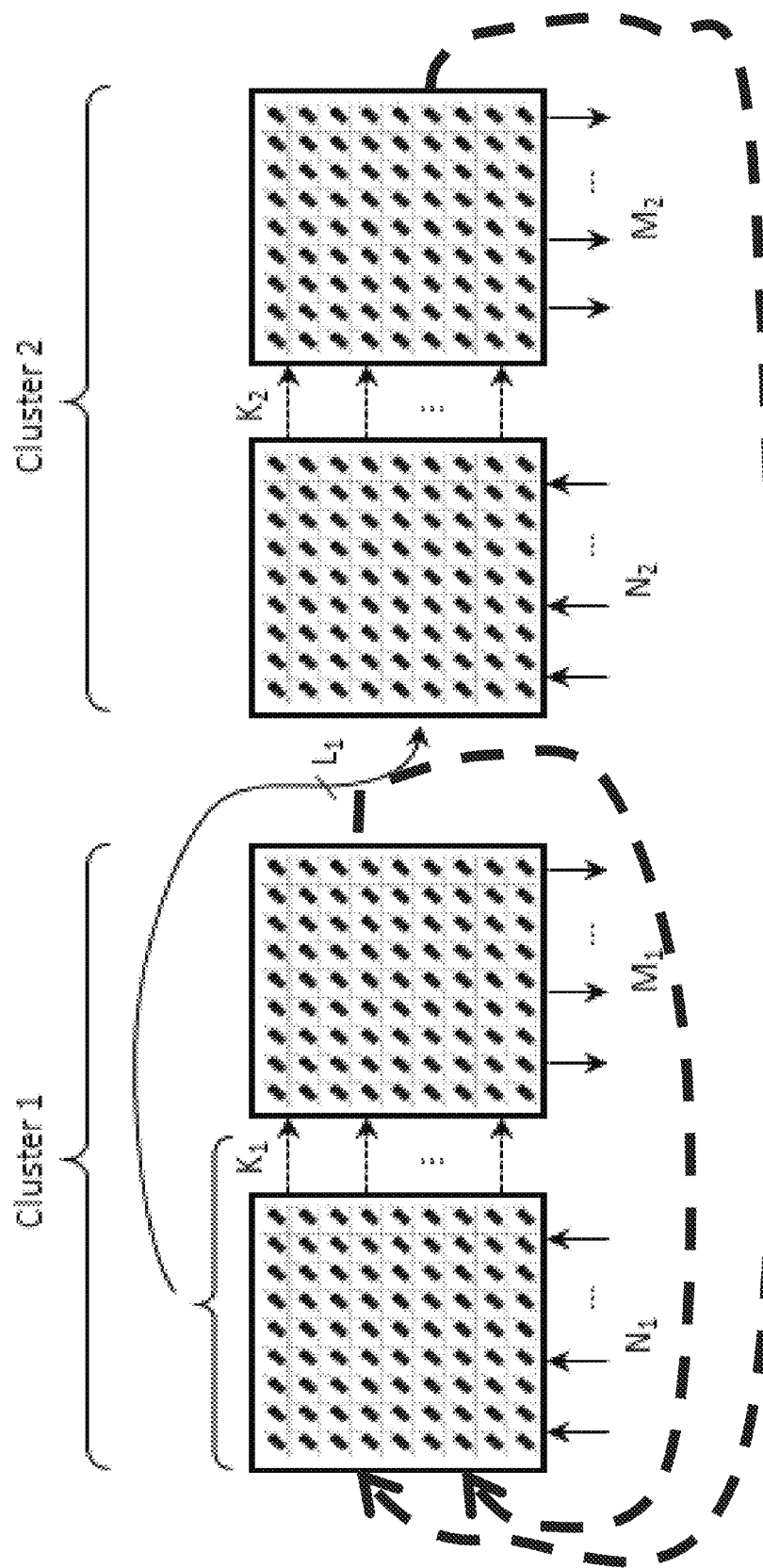
FIG. 2 illustrates two neural clusters that are connected with a subset of all possible connections between the neuron layers of the clusters according to embodiments of the disclosed technology.

Any subset of the template of FIG. 3 will also be supported by the control plane approach according to embodiments of the disclosed technology. The inter-array communication network can contain both feed forward connections (solid arrow between two clusters in FIG. 2) and recurrent feedback connections (dashed connections between two clusters or among a single cluster in FIG. 2).

The remainder of this description is focused on embodiments of the disclosed technology implemented for the local arrays. The disclosed technology, however, is not limited thereto, and is also applicable for instance for the inter-array communication network.

Figure 4:
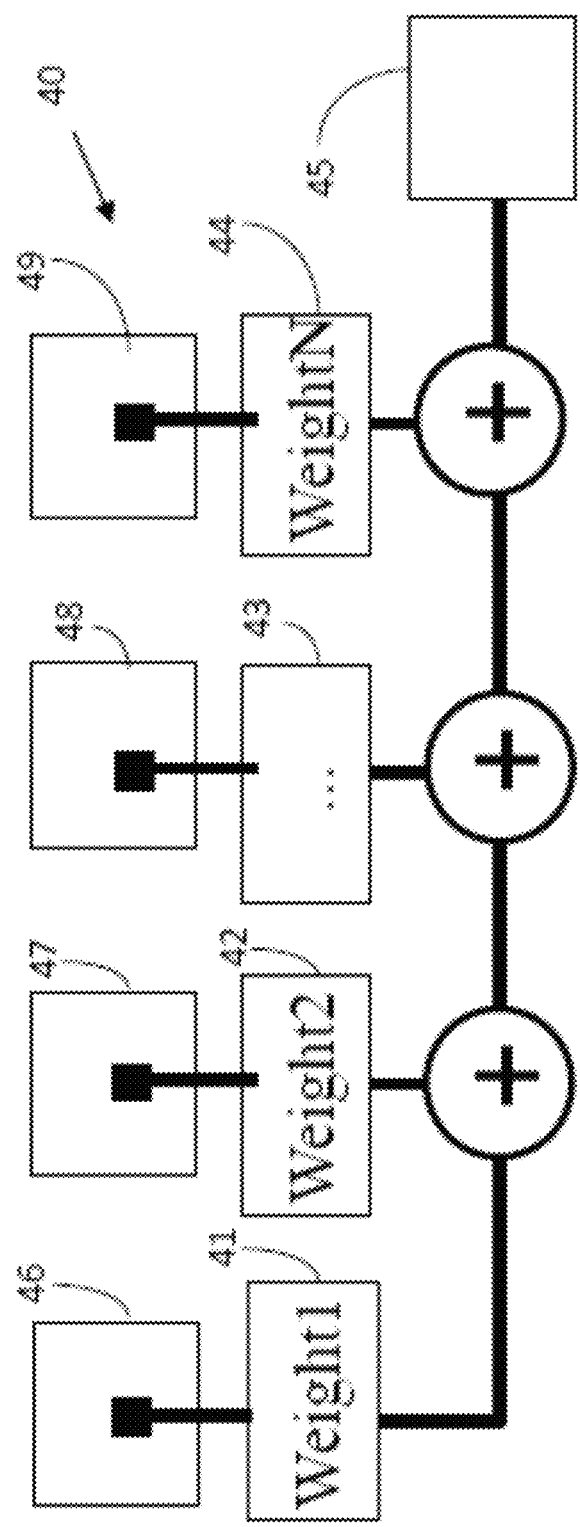
FIG. 4 represents one row of a prior art local array according to embodiments of the disclosed technology.

A more detailed view of the internal organization of such local arrays 40 is provided in FIG. 4. Several parameters, e.g., weights, 41, 42, 43, 44 (Weight1 to Weight N) have to be combined/multiplied with the input neuron data received at neuron inputs 46, 47, 48, 49, and the result has to be accumulated and sent to a neuron output 45 where typically a so-called activation function is applied on the accumulated sum. The control plane has to realize the updating of the parameters 41, 42, 43, 44 which can happen once at programming time (parameter loading) and/or on-line during dynamic learning (parameter adaptation).

The disclosed technology provides a control plane for controlling transfer of data to a data plane. For clarifying the basics of the disclosed technology, abstraction is made from whatever happens in the data plane. A schematic overview of such control plane 100 is given in FIG. 15.

The control plane 100 comprises:
- a first number n of at least two memory cells Dj−1, Dj, Dj+1 for each storing a digitally coded parameter value, which can be a single or multi bit value. Each memory cell Dj−1, Dj, Dj+1 has a data input electrode 101, a data output electrode 102 and a control electrode 103;
- at least two data input terminals 104 for each receiving a data input value and applying it to the data input electrode 101 of one of the memory cells (Dj−1, Dj, Dj+1) to which the data input terminal 104 is coupled, and
- at least two data output terminals 105, each coupled to a data output electrode 102 of one of the memory cells Dj−1, Dj, Dj+1.

In the following, the data input terminals 104 and the data output terminals 105 which are connected to a particular memory cell Dj−1, Dj, Dj+1 are called input and output terminals "associated" with the memory cell Dj−1, Dj, Dj+1, respectively.

Figure 15:
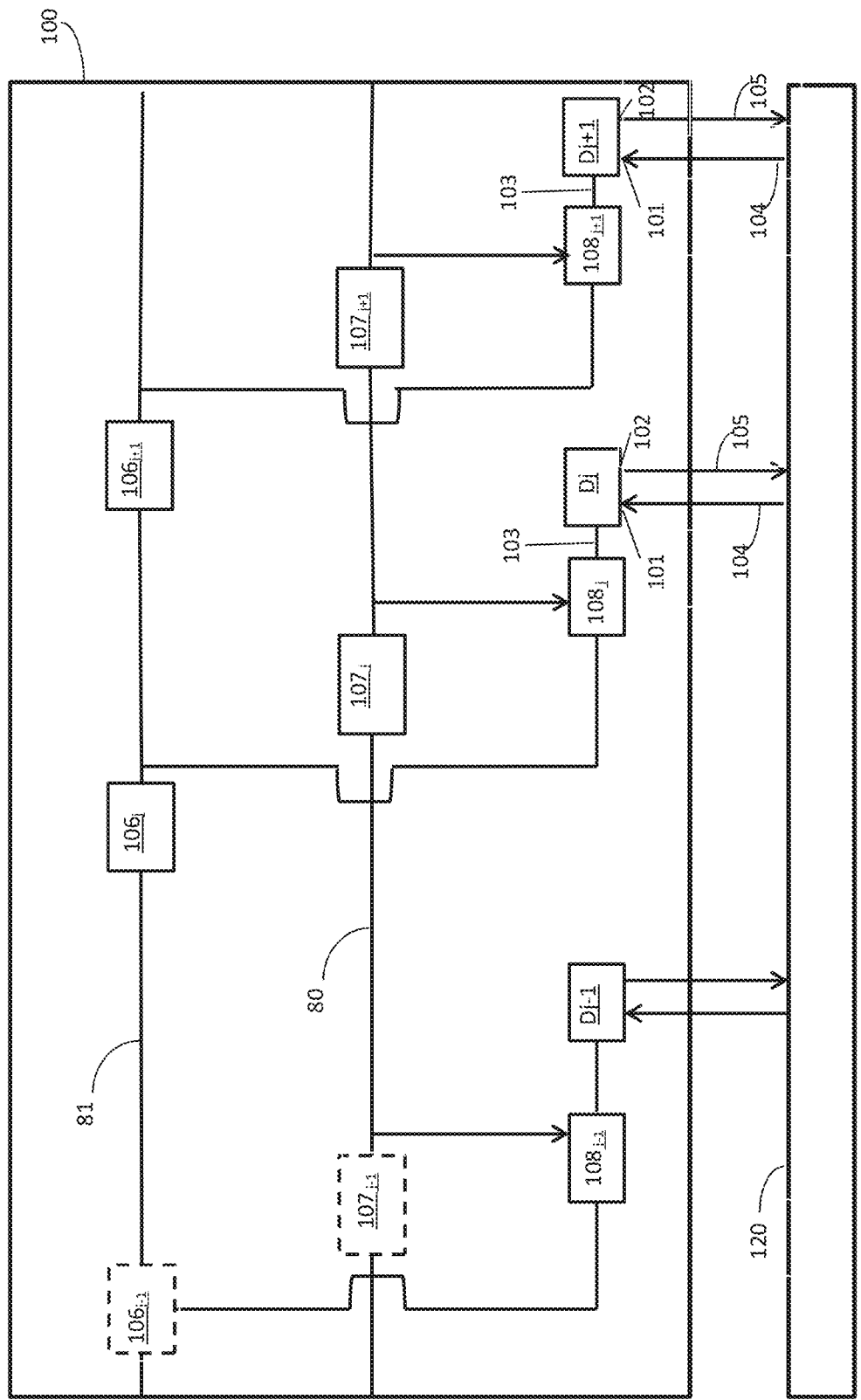
FIG. 15 illustrates a control plane for controlling transfer of data to a data plane, according to embodiments of the disclosed technology.

The control plane 100 also generally comprises a first delay line 81 comprising n or n−1 first delay elements $106_{j-1}$, $106_j$, $106_{j+1}$. The first delay line 81 is arranged for receiving a stream of control bit values. The control plane 100 is configured such that each first delay element $106_{j-1}$, $106_j$, $106_{j+1}$ controls based on its current control bit value, by means of an access control device $108_{j-1}$, $108_j$, $108_{j+1}$, the transfer of data received by a memory cell Dj−1, Dj, Dj+1, e.g., from a data plane 120, via its associated data input electrode 104 to its associated data output electrode 105 and as such, e.g., back to the data plane 120, once combined with the digitally coded parameter value stored in this memory cell Dj−1, Dj, Dj+1. In particular embodiments, the signal applied to the first delay line 81 may be adapted such that the very first delay element $106_{j-1}$ can be left out, as illustrated in FIG. 15 by the dashed lines. This, however, requires adaptation of the signal applied to the first delay line 81, equivalent to the presence of a delay element $106_{j-1}$.

The control plane 100 also generally comprises a second delay line 80 comprising n or n−1 second delay elements $107_{j-1}$, $107_j$, $107_{j+1}$. The second delay line 80 is arranged for receiving an enabling signal for enabling the control bit values of the stream of control bit values in the first delay line 81 to be passed to the control electrode 103 of the associated memory cells Dj−1, Dj, Dj+1 such that, when data in appears at the data input electrode 104 associated with a memory cell Dj−1, Dj, Dj+1, it is transferred in a controlled and synchronized fashion to the associated output electrode 105, depending on the stream of control bit values and the enabling signal. Similar to the first delay line 81, also the second delay line 80 does not need, in particular embodiments, the very first delay element $107_{j-1}$ in the series, as again illustrated in FIG. 15 by the dashed lines. This, however, again requires adaptation of the signal applied to the second delay line 80, equivalent to the presence of such delay element 107.

Figure 7:
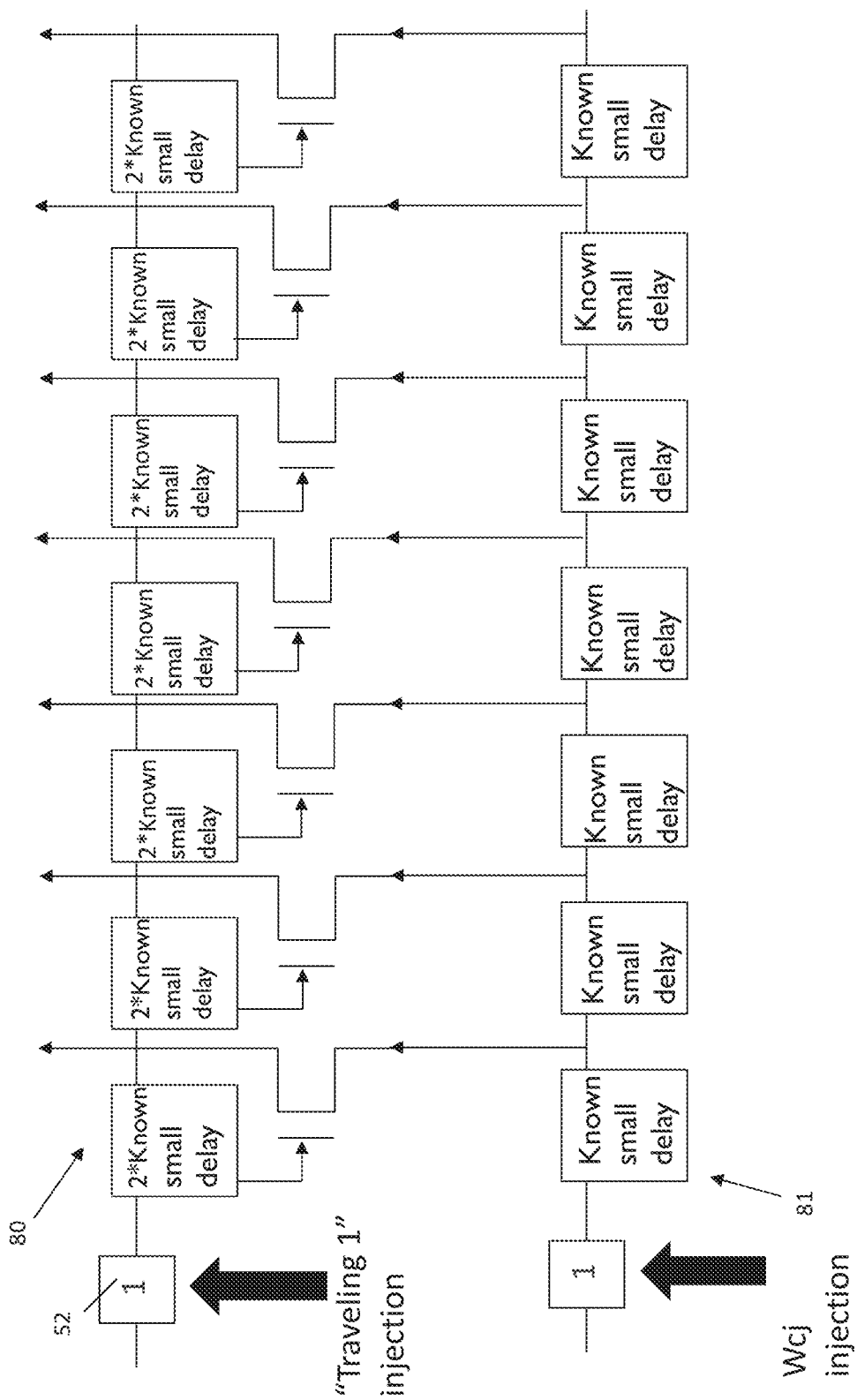
FIG. 7 illustrates one row of a control plane for a local array according to an embodiment of the disclosed technology.
Figure 9:
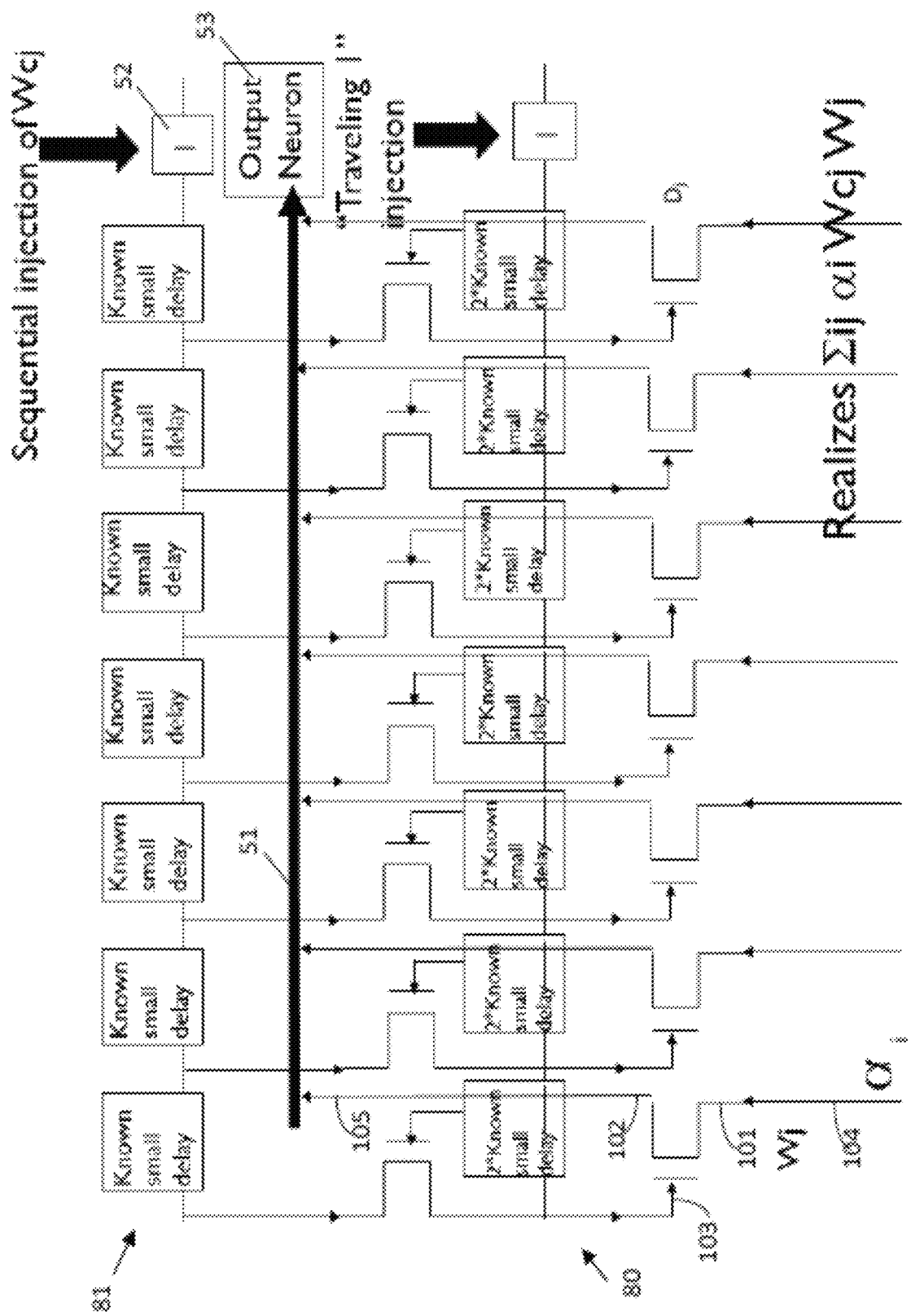
FIG. 9 illustrates one row of a local array according to embodiments of the disclosed technology, such as in FIG. 7, including data plane and control plane.

In one embodiment, the disclosed technology relates to a control plane controlling the parameter update of a local array 40 as shown in FIG. 4. An embodiment of the proposed solution is illustrated in FIG. 7 and FIG. 9 and is described hereunder. One innovative aspect is the use of a first delay line 81 where a stream of parameter control bits (e.g., weight control bits) $Wc_j$ is sequentially injected. The parameter control bits $Wc_j$ indicate whether the corresponding parameter is used or not. These parameter control bits $Wc_j$ are then distributed by the delay line structure 81 to high impedance control electrodes (gates) 103 of an array of switches (e.g., transistor devices) $D_j$ (not illustrated in FIG. 7, illustrated in FIG. 9). The switches $D_j$ are preferably selected so as to have a low leakage current, e.g., below $10^{-8}$ A, or even below $10^{-13}$ A, such that values can be stored for at least a predetermined time period depending on the application, for instance for at least one day. These switches, e.g., transistor devices $D_j$, can for instance have a geometrical weighting implemented to realize the parameters (e.g., weights) $W_j$, as explained further on. At a first main electrode 101 of the switches, e.g., the source port of the transistor devices $D_j$, neural data bits αi (neuron data input for switch on a multi-bit bus) are supplied. In this way, the switches, e.g., transistor devices $D_j$, realize a bitwise AND which is equivalent to a primitive bitwise multiplication. If the injected parameter control bit is 0, nothing happens. If the injected parameter control bit is 1, the neural data bit αi is multiplied with the parameter stored in the switch, e.g., transistor device $D_j$, to which the neural data bit αi is supplied. The output on a second main electrode 102 of the switches, e.g., the drain port of the transistor device $D_j$, is a charge proportional to this multiplication. By combining the charges at the second main electrodes 102 of the plurality of switches, e.g., the drain ports of the plurality of transistor devices $D_j$, and accumulating them on a shared output wire 51 (see FIG. 9), the desired function of a neural algorithm kernel as shown in FIG. 4 is implemented, namely a pairwise weighted sum of at least i multiplications between neural data bits and parameter values: $\Sigma_{ij} \alpha_i W_{cj} W_j$. In this formula, i runs from a first value $i_{start}$ to a second value tend, and j runs from a third value $j_{start}$ to a fourth value ($j_{start}$+ $i_{end}$−$i_{start}$). The detection of accumulated combined charges can only happen if the charge is conserved long enough, and hence if the output wire 51 or the output node 53 to which it connects is high impedance, for a long period.

The first delay line structure 81 allows achieving a very low area cost because it restricts the number of parallel control wires in the control plane which would typically be required for obtaining full connectivity of the control distribution. This way, area saving is implemented in the control plane, as a trade-off with time required to ripple all values through the system. The reduced wire overhead according to embodiments of the disclosed technology also restricts the capacitive load in the control signals and hence the dynamic energy of the control plane used for controlling the data plane. It comes at a cost of an increased latency to wait for all the parameters to be updated sequentially. But that is acceptable for the typical neural algorithms, both for feed-forward (in the data plane) and recurrent algorithms proposed in the literature, or for other applications wherein the parameters $W_j$ do not need to be updated frequently. Sometimes parameters have to be updated only once a day, sometimes faster. For instance running the first delay line 81 with a few 100 elements in the line at a clock rate of 100

MHz, may be sufficient if the sample rate is 10 kHz. The delay (or latency) of the delay line has to be selected such that the updating speed specification is met. Depending on how many parameter bits have to be controlled, a number P of parallel delay lines then have to be provided in the overall control plane organization. At least one delay line per row of memory cells is provided, but the disclosed technology is not limited thereto, and in particular embodiments multiple delay lines may be provided per row of cells.

Figure 5:
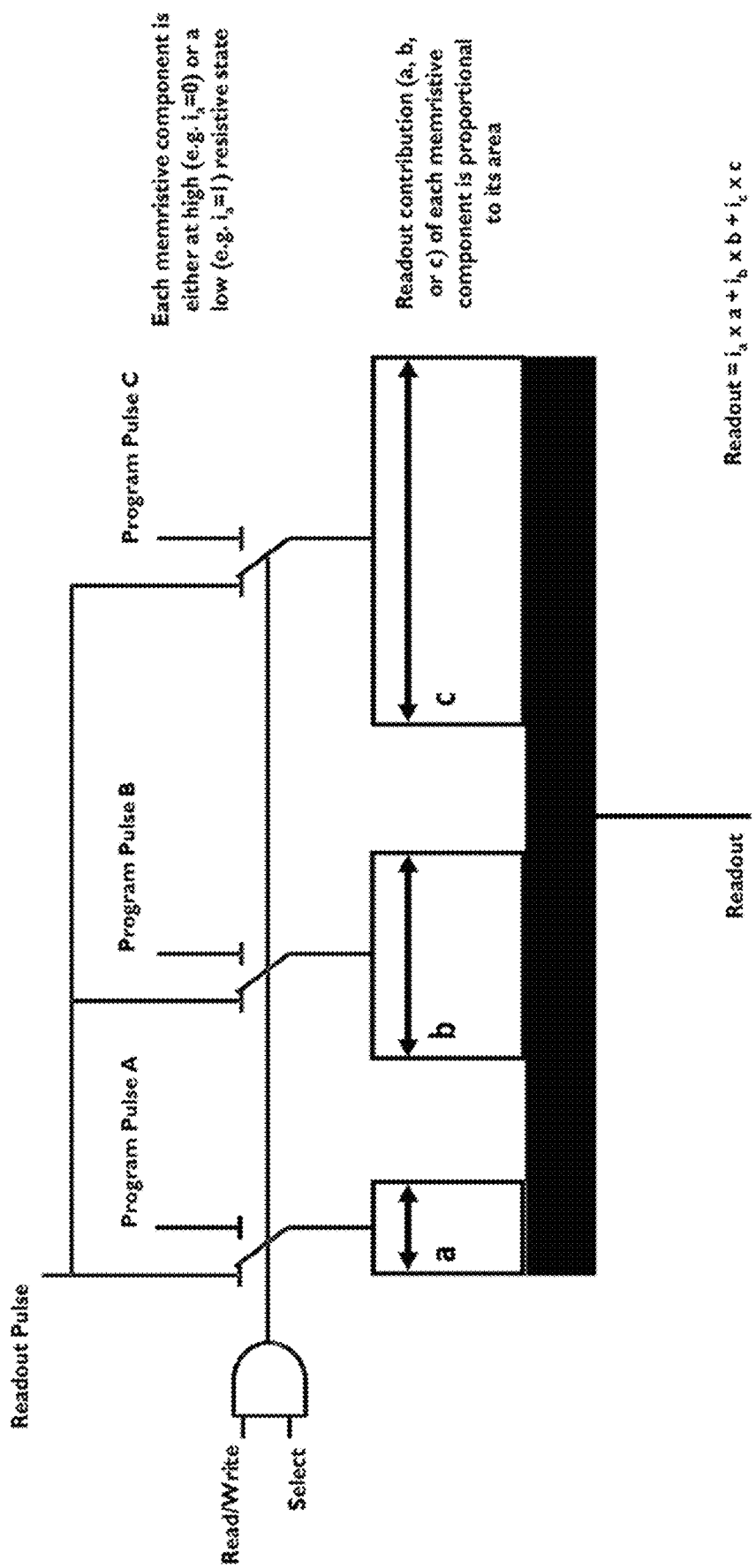
FIG. 5 illustrates geometrical binary coding which can be used in a local array, according to embodiments of the disclosed technology.

According to embodiments of the disclosed technology, a geometrical coding of the parameters Wj can be implemented. This is further illustrated in FIG. 5 and FIG. 6. The geometrical coding of the parameters Wj can be realized setting the capability of the transistor devices $D_j$ to pass current of different sizes. In one embodiment this can be done by sizing the width a, b, c of the gates of the transistor devices $D_j$ as powers of 2 (1, 2, 4 and so on), as illustrated in FIG. 5. In another embodiment this can be done by sizing the Vth threshold of the transistor devices $D_j$ in a similar way. In an embodiment, the transistor devices $D_j$ are memory cells of Flash type. In this case the Vth threshold of the transistor devices $D_j$ can be sized by trapping electrons in the gate dielectric stack or in a floating gate, by applying proper programming pulses to the terminals of the transistors $D_j$. In another embodiment, the transistor devices $D_j$ are non-volatile memory cells of ferroelectric type (Ferroelectric Field Effect Transistor of FeFETs). In this case the Vth threshold of the transistor devices $D_j$ can be sized by changing the polarization of the gate dielectric by applying proper programming pulses to the terminals of the transistors $D_j$. In all cases the output charge is impacted in a proportional way.

Figure 6:
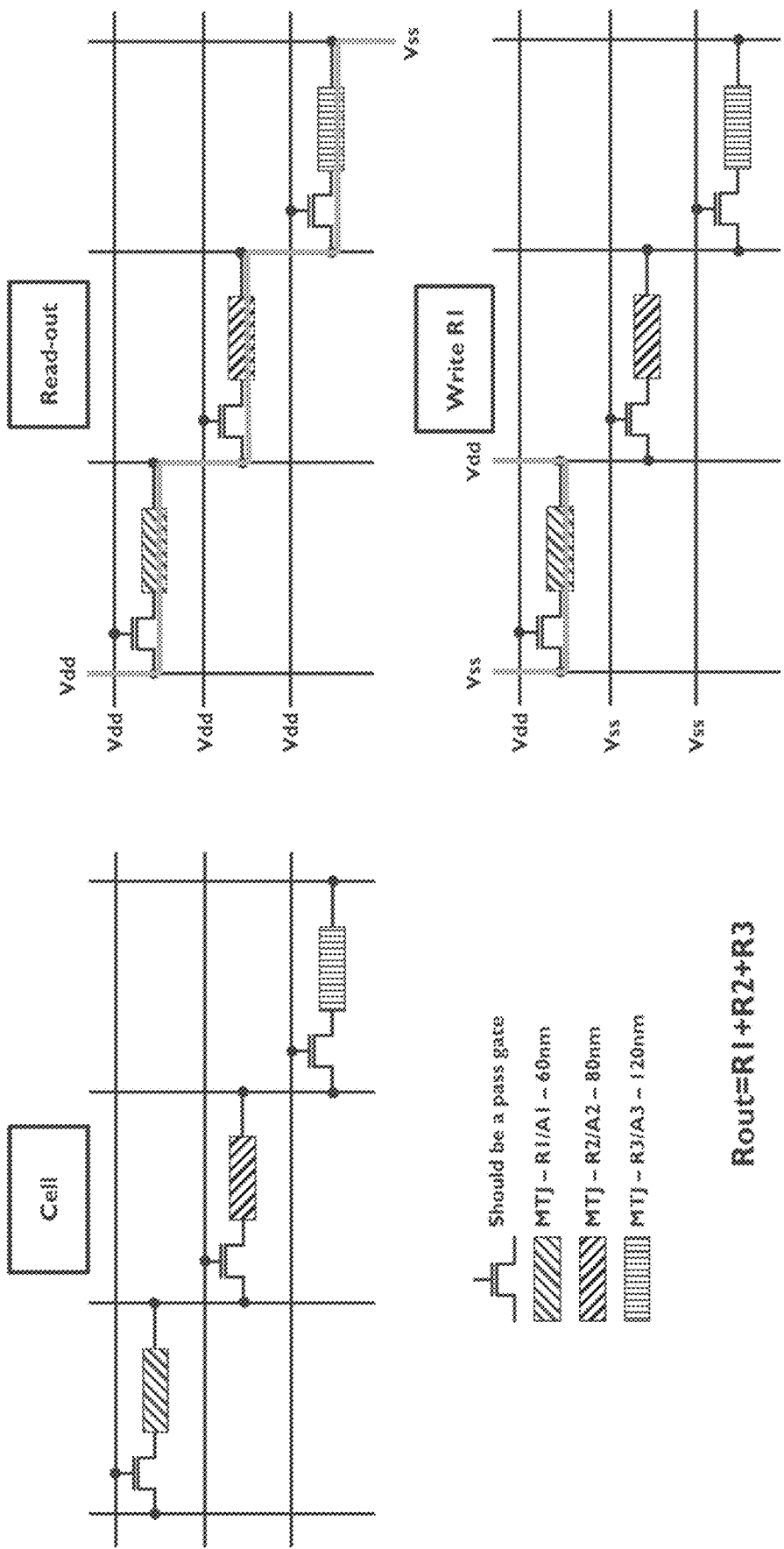
FIG. 6 illustrates an example readout scheme of the local binary coding as illustrated in FIG. 5 according to embodiments of the disclosed technology.

FIG. 6 illustrates another possible implementation of the geometrical coding of the parameters $W_j$. The proposed solution aims at implementing the parameter $W_j$ as the equivalent conductance $G_j$ of a memory cell comprising a plurality of switches and resistive memory elements. The memory cells are connected in series to the transistor devices $D_j$. As a result, the transistor Dj will be capable of passing a current proportional to the impedance $G_j$ of the cells connected in series. In the proposed circuit schematic of FIG. 6, one resistive memory cell with equivalent conductance $G_j$ is illustrated. One cell comprises N switches connected in series to N resistive memory elements. In general the number of elements N is larger than 1. In the example hereby illustrated, N is equal to 3. Each switch can be for instance a single transistor or a transmission gate. The switch may be fabricated with TFT technology or any other switch device which has limited leakage. A resistive memory element refers here to an electronic device that can be programmed, with proper electrical stimuli, into two (or more) resistive states: the High Resistive-State (HRS) and the Low Resistive-State (LRS). Optionally the device can be programmed to multiple resistive states, each characterized by a resistivity value lower than HRS and higher than LRS. Possible choices of resistive memory device types are: Magnetic Tunnel Junction (MTJ), phase-change memory, nonfilamentary resistive memory, ferroelectric memory. A pair of items composed of one switch element and one resistive memory element is called a 1 Transistor-1 Resistor (1T1R) element. A 1T1R element is obtained by connecting in series the drain of the transistor and one electrode of the resistive memory element. Each 1T1R element comprises 3 or more electrode terminals: at least one high impedance gate terminal (switch control terminal), a source terminal (source of the transistor) and a drain terminal (other electrode of the resistive memory element). The impedance of one 1T1R element is the impedance measured between the source and drain terminals of the 1T1R element, when the gate terminal is biased so that the switch is conductive. N distinct 1T1R elements are arranged into an array, so that each 1T1R element can be addressed individually to program the resistive memory element to a desired state without altering the state of the other 1T1R elements. The equivalent impedance $G_j$ of the cell is the impedance of N 1T1R elements connected in series. A specific feature of the chosen resistive element technology is the dependence of the resistance value of the device on the cross section area of the memory device itself. The larger the cross-section, the larger the conductance (the smaller the resistance). The geometry of the memory elements of the cell can thus be sized so that each resistive element holds specific values of resistance corresponding to HRS and LRS, depending on its geometry. The conductance value of each 1T1R element is proportional to the geometrical size of the resistive memory element. By sizing the dimensions of the devices according to specific ratios, it is possible to assign to each 1T1R a different parameter in the computation of the equivalent conductance of the cell $G_j$. For example, by sizing the relative dimensions of the devices according to powers of 2 ($2^0$=1, $2^1$=2, $2^2$=4, $2^3$=8 and so on) it is possible to implement a binary coding of the parameter $W_j$ expressed as a binary number: the largest device, featuring the largest conductance (smallest resistance) can be used to encode the Most Significant Bit (MSB) of the binary number, the smallest device can be used to encode the Least Significant Bit (LSB) of the binary number. The use of multiple resistance states enables the use of alternative numeric encodings: for example, a ternary coding can be implemented by sizing the memory devices according to powers of 3 (1, 3, 9, 27 and so on) and programming each resistive memory element to one out of 3 possible resistivity states. Multiple combinations of device sizing and multilevel resistivity programming allow for the encoding of the parameter $W_j$ with mixed radix encoding.

In principle, the above geometrical parameter coding approach can also be beneficial to reduce the amount of devices needed when charge-based functionality is exploited, as in the case of low-leakage TFT devices. In that case the width of these devices or the Vth threshold can be coded in geometrical powers (e.g., binary as illustrated above). The charge that is accumulated on these TFT devices is then proportional to the geometric code and so the same effect is realized as described for the resistive devices above. Hence, the proposed geometric coding of the parameter can be used in the inter-array communication network and also at the level of the local array, in the data plane. This is the case both for resistive and for charge-based devices.

It is an advantage of embodiments of the disclosed technology that the control plane organization can be implemented at least partly in a back-end-of-line (BEOL) fabric with TFT technology, for instance ultra-low leakage TFT technology, for instance having a leakage value below $10^{-8}$ A for each switch. The use of ultra-low leakage TFT devices implies that only parameter updates which change the data value have to be effectively loaded. All the other parameter values will stay semi-permanently stored on the gates of the ultra-low leakage TFT devices.

It is therefore advantageous if not only the data busses are isolated by nearly non-leaking TFT switches, e.g., TFT switches having a leakage current of $10^{-13}$ A or below, at their boundaries, but that also the control lines are isolated. That will allow to put on, in the order of $10^{13}$ switches with about 1 W overall leakage, as needed to approach brain-size communication networks. It is to be noted that such a switch typically contains many individual devices (depending on the circuit diagram used) so the specification on the individual devices of the switch is much lower, e.g., in the order $10^{-15}$ Å and below. When a number of data bits share the same control line, it means a single control line can be shared also in the netlist for the local array. If this control line then has an "isolation switch" 52 at the entry point of the first delay line 81, where the information of the next control state is sent/driven, this isolation switch 52, e.g., TFT isolation switch, can make sure that the control line keeps its state (nearly without leaking) as long as that position of the 3-way data switch $D_j$ (e.g., transistor) should be maintained. In practice, many data values $\alpha_j$ are transferred across the 3-way switch $D_j$ in that position, sequentially in time, before it has to be changed. That avoids the waste of unnecessary dynamic energy to be spent on the control lines, as it does not leak and keeps its value. The data values $\alpha_j$ can for instance be transferred at a few 100 MHz in a packet of N values and for that entire packet the 3-way switch $D_j$ remains in the same control state. After this packet has passed, it can be that the 3-way switch $D_j$ is not used for some time and then everything is just maintained where the control state is still not modified. Also when the control state for the next data packet maintains the same path, the control line does not need to be updated. Only when a new data packet has to be transferred through another path, the control of the 3-way switch $D_j$ has to be updated and some dynamic energy has to be spent.

In a particular embodiment, the TFT devices are advantageously implemented with Indium-Gallium-Zinc-Oxide (IGZO) or ITZO devices, which exhibit extremely low leakage, e.g., below $10^{-15}$ A per device, leading to well below $10^{-9}$ A for the entire switch, further reducing the global power and energy cost functions. The term IGZO encompasses all realizable varieties of the compound $In_x$-$Ga_yZn_zO_w$ in terms of the values of the atomic numbers x, y, z and w, for example $In_2Ga_2ZnO$.

The disclosed technology also relates to a method for synchronizing the stream of control bit values with the proper insertion rate of new weight values corresponding to the rate at which new data values are introduced in the memory cells $D_j$. This is also illustrated in FIG. 7. As shown in this drawing, the delay line structure is actually implemented with two separate delay lines 80, 81. A first delay line 81 contains the stream of injected parameter control bits Wcj (e.g., at the bottom in FIG. 7, at the top in FIG. 9). The second delay line 80 contains a stream of synchronization bits realized with a so-called "traveling one". In order to align the proper synchronization bits with the moving Wcj, the second delay line 80 has to contain delays which are exactly twice as long as the corresponding delays in the first delay line 81. With "corresponding delays" is meant the $j^{th}$ delay in each delay line, from start till end. For proper functioning it is important that the delays match pair-wise, so the $j^{th}$ delay units of the first delay line 81 and of the second delay line 80 have to match each other, and also the $(j+1)^{th}$ and so on.

Figure 8:
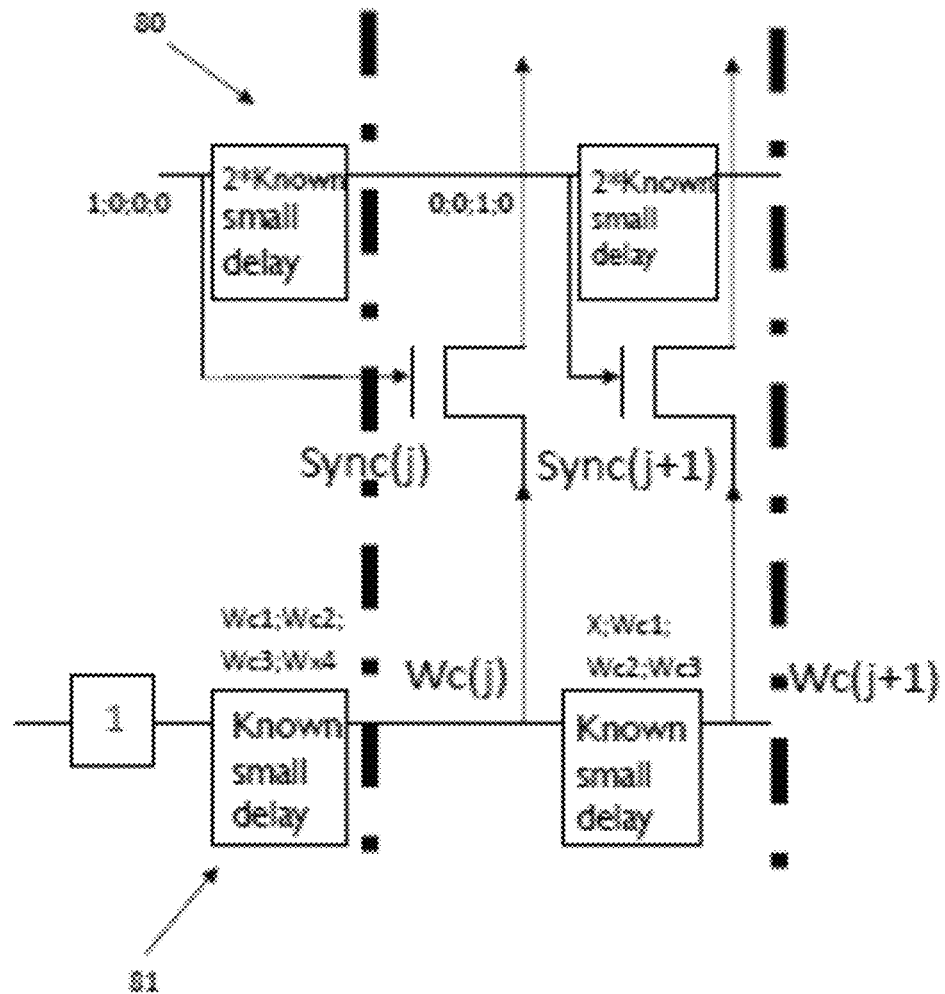
FIG. 8 illustrates in more detail the parameter control implemented by the control plane according to embodiments of the disclosed technology, such as in FIG. 7.

The proof of why this operates correctly is shown by induction in FIG. 8. Parameter control values Wc1, Wc2, Wc3, Wc4 are sequentially injected in the first delay line 81, at a rate compatible with the known small delay of that delay line 81. A synchronization bit (traveling 1) is injected in the second delay line 80. The parameter control values Wcj go to control the input sequence, so also the opening of the control TFT device Dj has to be at a compatible pace. Hence the delay of the second delay line 80 needs to be twice the delay of the first delay line 81 to let Wc(j+1) reach the jth position and be aligned with sync(j+1). The simulation of a small stream of bits also illustrates the alignment, e.g., "1" in 1;0;0;0 is aligned with Wc1 in Wc1; Wc2;Wc3;Wc4, while "1" in 0;0;1;0 is aligned with Wc2 in X; Wc1; Wc2;Wc3. If this works for a specific j value, then it will also work for the next stage (j+1) by induction. Delays of the delay elements of the first and second delay lines 81, 80 do not have to be equal within a delay line. However, the delays have to match pairwise, i.e., the known small delay of the first delay line 81 has to match twice the known delay in the second delay line 80 at a corresponding stage.

The combination of this more detailed control plane circuit implementation with the neuromorphic data plane of the local arrays is illustrated in FIG. 9. The control plane circuit comprises two delay lines, as explained with respect to FIG. 7.

In particular embodiments, the method may use so-called wave pipelining to realize the first and second delay lines. In that case no clock signal is required. Wave-pipelining implements pipelining in logic without the use of external latches or registers. It provides a method for significantly reducing clock loads and the associated area, power and latency while retaining the external functionality and timing of a synchronous circuit.

Figure 10:
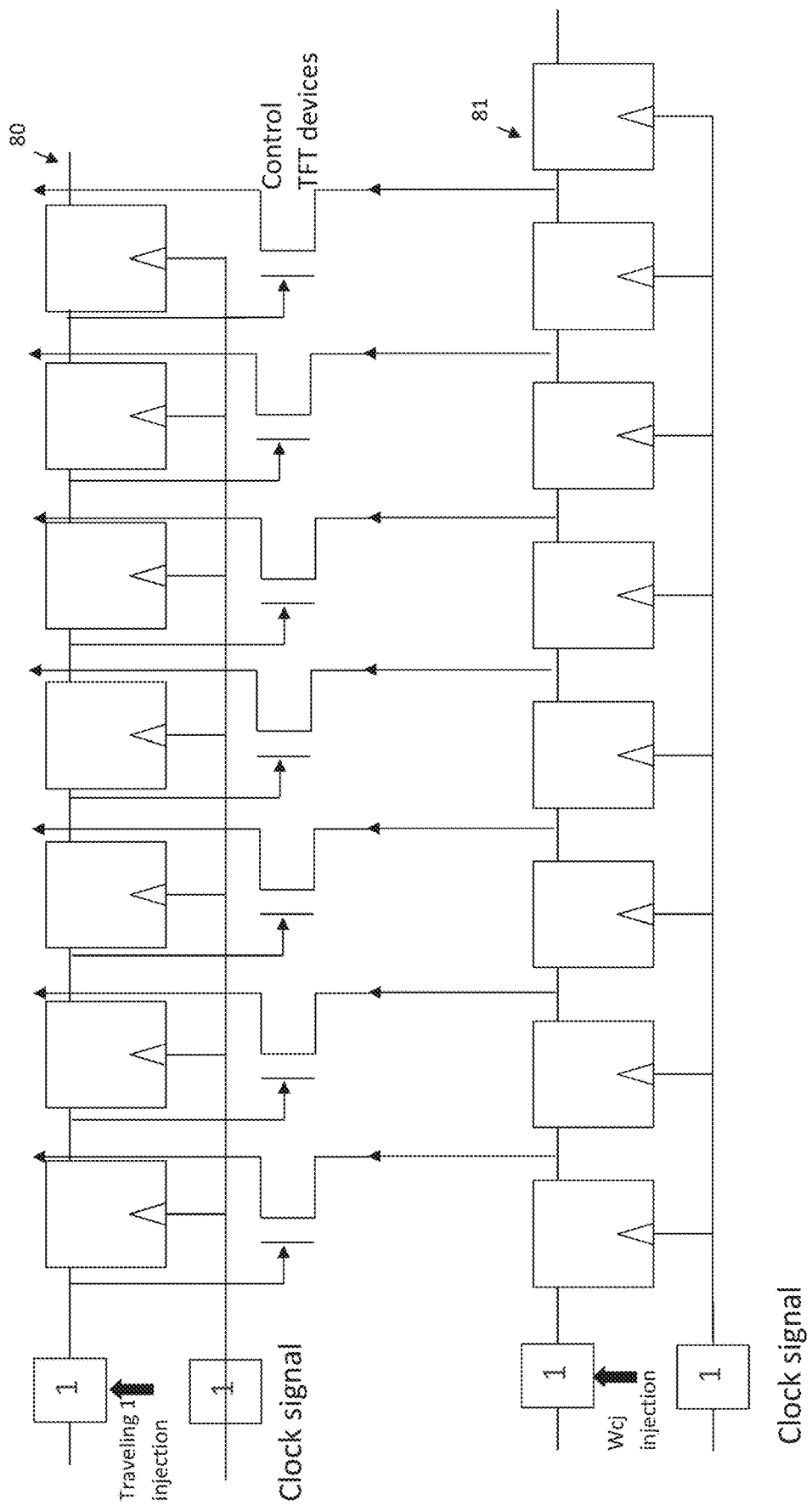
FIG. 10 illustrates an alternative implementation of a row of a control plane of a local array according to embodiments of the disclosed technology, where a delay line is implemented by means of shift registers.

In alternative embodiments it is also possible to utilize clock signals to achieve a fully synchronous implementation, as shown in FIG. 10 for an implementation with a synchronous shift register, for instance CMOS shift registers. These embodiments cannot be as fast as wave pipelining. Moreover, more wiring is required, hence also more energy consumption and more area. In the embodiment illustrated in FIG. 10, control values Wcj are sequentially injected at clock rate. Values go to control input sequentially so also the opening of the control TFT device has to be at the same rate. After control value injection, the control TFT devices are shut off, hence the shift registers are shut off, and only near-zero leakage occurs. Values are stored on the gate capacitance by TFT devices.

Figure 14:
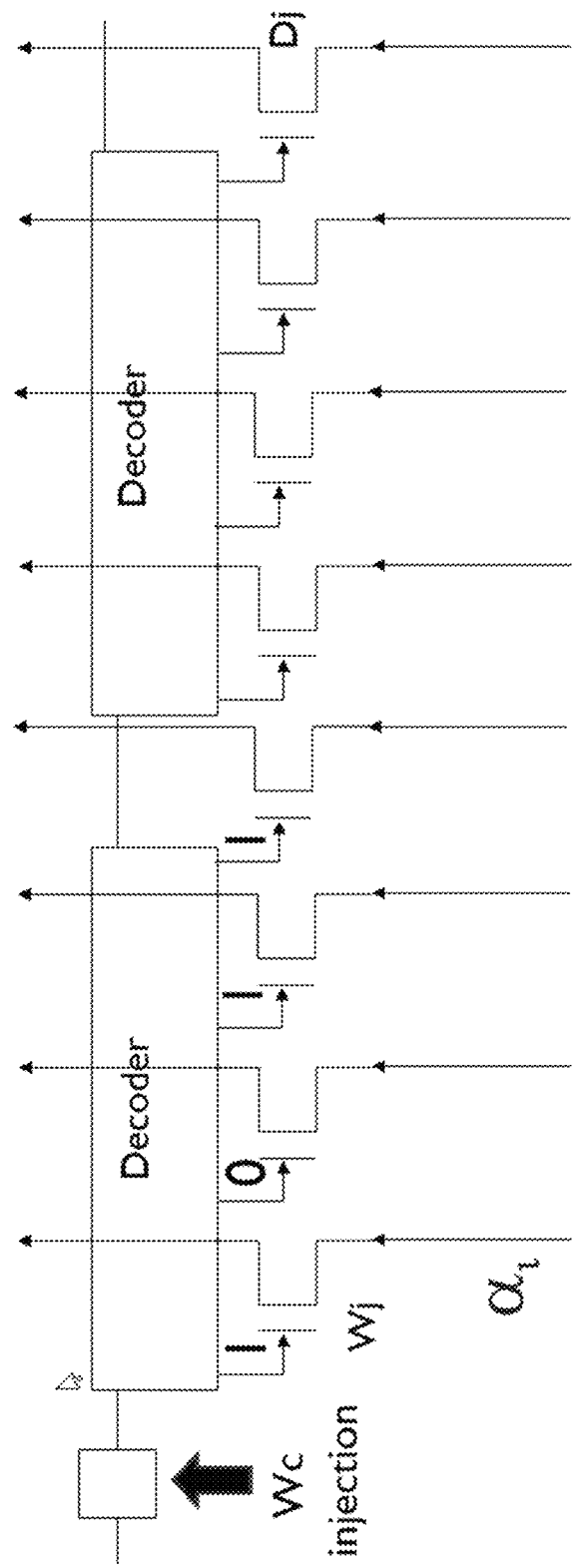
FIG. 14 represents one row of a control plane for a local array according to further embodiments of the disclosed technology, including multi-bit decoders in the delay line.

In yet other embodiments, the control plane approach can also utilize local decoders to reduce the number of parameter control bits that have to be injected in the delay lines. If a n-to-$2^n$ decoder, e.g., a 2 to 4 decoder as in FIG. 14, is placed at each of the local delay line stubs, the number of Wcj's is reduced with a factor $2^{(n-1)}$ compared to not using decoders. This provides another trade-off in the overall area, energy, delay Pareto space. Decoders 90 also allow use of larger values, e.g., instead of binary bits in the stream of control bit values, as in the example above. More than one value can come out of a decoder 90, as for instance illustrated in FIG. 14. In this example, four-bit decoders 90 are provided, each providing a parameter control value to any of four switches Dj. Of an injected parameter control value stream, an incoming value II may for instance be decoded by a first decoder 90 into a four-bit value 1011, the bits of which are each applied as a parameter control signal to the corresponding switches, e.g., transistor devices $D_j$. In general, the number of potential decoder output value combinations (in binary form) is higher than the actually utilized ones because the number of input bits is typically lower than the number of output bits. As from then, the functioning is as explained with respect to FIG. 7.

Figure 11:
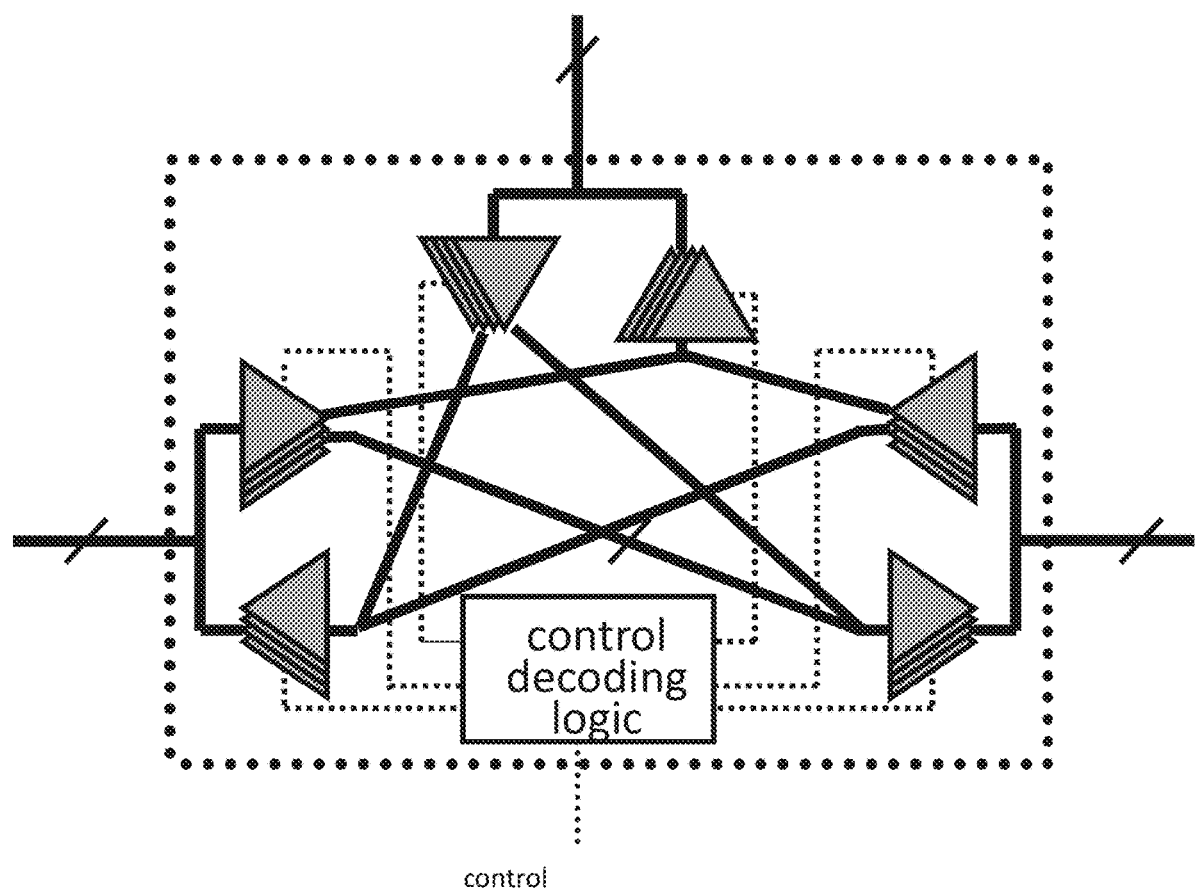
FIG. 11 illustrates the TFT elements that can be used as on-chip segmented bus switch in embodiments of the disclosed technology.

In still other embodiments, the control plane structure is also usable for controlling the data plane of the inter-array communication network. A basic 3-way switch for this network is shown in FIG. 11, and is described in more detail in EP15167580.8. The switches are ultra-low energy due to their negligible leakage (orders of magnitude lower than CMOS devices) and their low dynamic power (because they are directly fabricated on the middle levels of the BEOL the vertical via routing overhead is fully gone). Their main limitation is the restricted clock frequency they can reach (10-100 times lower than CMOS). The control of the switches does not need to be rerouted often, because it is expected that for long periods of time these global inter-cluster connections are stable. That makes the needed switches ideally suited for a realisation with the BEOL TFT devices. The segmentation switches are advantageously implemented with Gallium-Indium-Zinc-Oxide, GIZO, devices. These GIZO devices are in the literature sometimes also called IGZO devices, i.e., Indium-Gallium-Zinc-Oxide devices.

Figure 12:
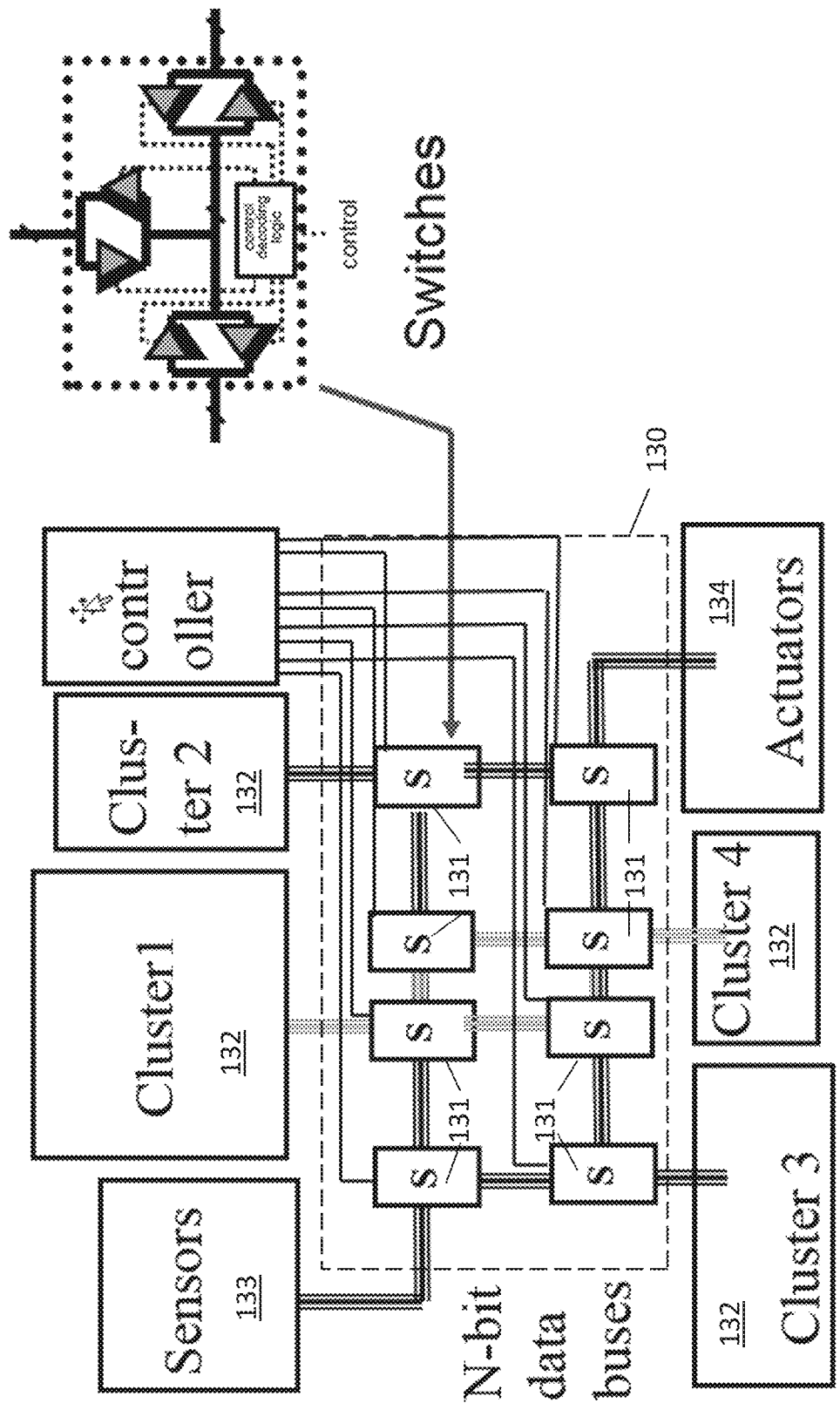
FIG. 12 illustrates an on-chip segmented bus for an inter-array communication network according to embodiments of the disclosed technology.

These 3-way switches as illustrated in FIG. 11 may be organized in a fully global inter-array communication network as illustrated in FIG. 12. The use of a segmented bus network 130 is proposed. It connects via switches 131 the available clusters 132 to each other and also ensures the communication with sensors 133 and actuators 134 This can be achieved by allocating only P parallel buses (P=2 in FIG. 12, namely the two horizontal busses), where P is the maximal amount of simultaneously alive global transfers.

Figure 13B:
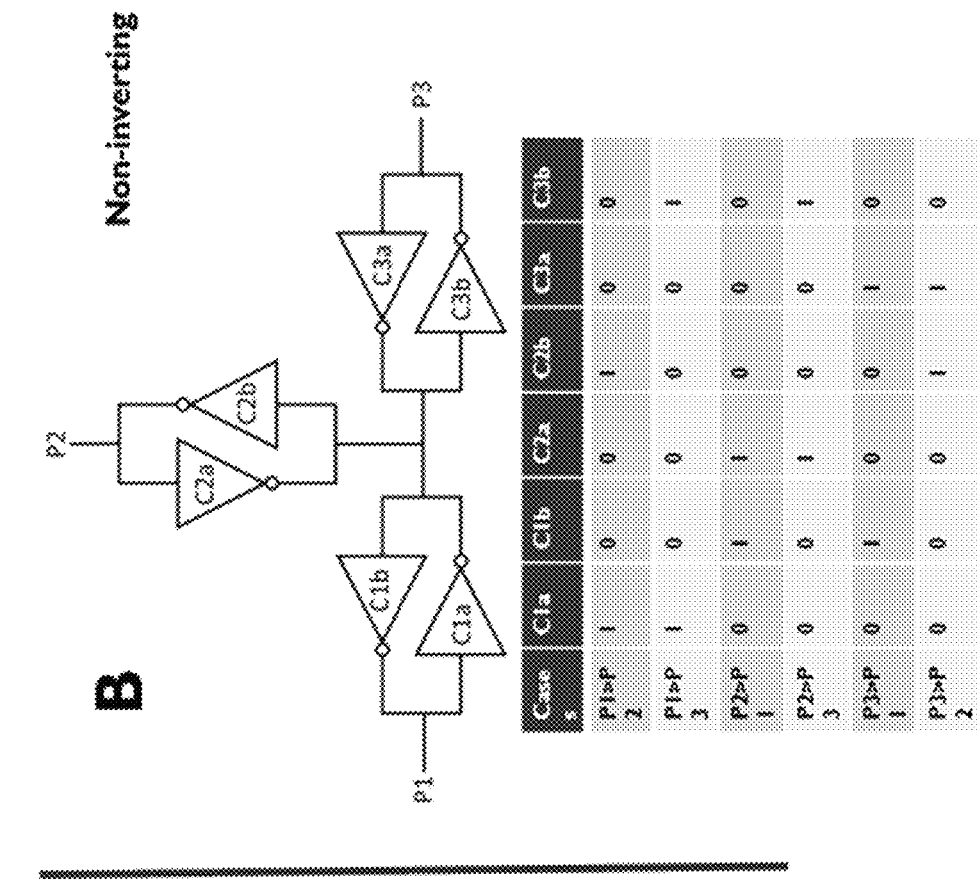
FIGS. 13A and 13B illustrate TFT-based switch topologies according to embodiments of the disclosed technology.
Figure 13A:
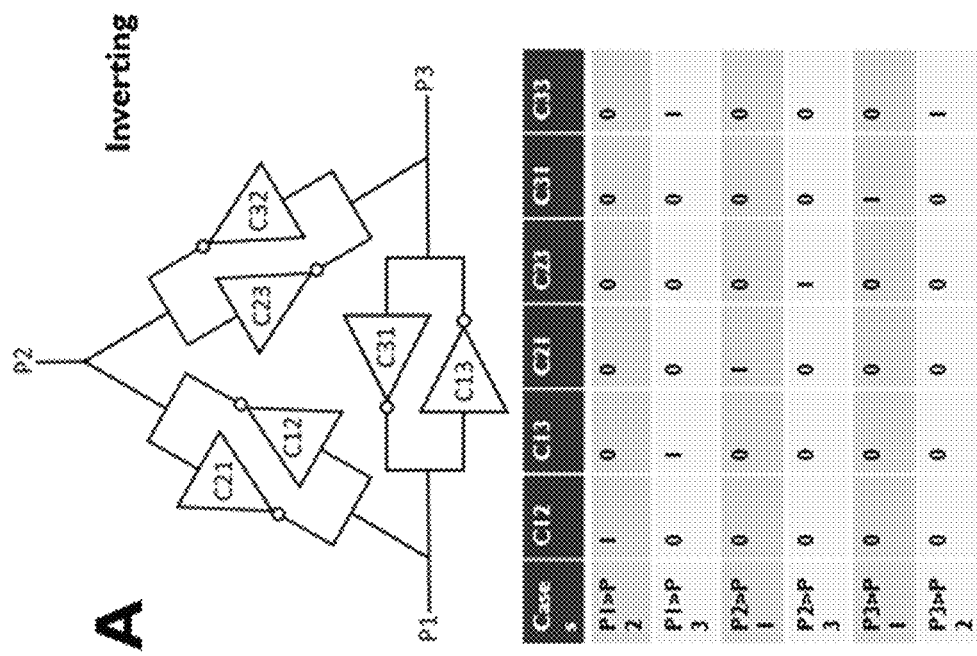

The control bits required to steer the switches 131 are illustrated in FIGS. 13A-B. These control bits can be effectively provided by the delay line structure of FIG. 9 proposed earlier, but now without the neuron data injected at the source of the devices Dj. Instead, the local array output ports are connected at the Dj source, and the input port of another local array is connected to the Dj drain.

In one embodiment the data plane of the communication network is implemented in a 3D layer structure, for example 3D integrated BEOL, a 3D package structure or a combination thereof. A 3D layer can be implemented with TFT, e.g., IGZO. Doing so strongly improves the scalability.

The time-division multiplexing is preferably organized according to a Local Parallel Global Sequential scheme.

In one embodiment the distributed loop buffer concept as described in EP1958059, which was initially intended for conventional instruction-set processor programming, is advantageously reused. This is a very energy-efficient solution to realize the look-up-table storing the (instruction) control bits for the potentially huge amount of devices Dj to be controlled.

For the neuromorphic synapse control, however, the distributed loop buffer concept should be reused in a re-projected form. For instance, in the illustration of FIG. 11 about 270K switches are needed. Each of these would require at least 4 bit control, so over 1 million bits have to be generated for each system scenario. If there are tens of thousands of system scenarios, the partitioning of the distributed loop buffer approach is very critical, but the energy gains compared to a conventional centralized instruction/control table is also huge. Moreover, a distributed loop buffer approach is very well matched to the exploitation of system scenarios. It may, however, also be combined with the suitable instruction bit compression/encoding schemes that are used in conventional microprocessors.

One solution according to embodiments of the disclosed technology indeed allows meeting the above-mentioned objectives. The proposed solution allows for scaling by adapting the number of parallel delay lines P. The flexibility is created by the potential to load any control bit sequence into the data plane. Further, by implementing the control plane at least for a part in a BEOL fabric with TFT devices, the scalability and in particular the leakage energy-efficiency of the proposed solution is even more improved. The realisation of devices in BEOL allows directly reducing the vertical wire length in a substantial way (because one does not have to go back and forth to the FEOL layer for all devices in the delay lines) and also the horizontal wire length is reduced because a significant amount of devices can be removed from the FEOL layer, so the overall area then reduces with a resulting average wire reduction as added advantage. So, as a result, the specific trade-offs between the main design objectives are changing, in particular area, energy and performance. This BEOL TFT device implementation can advantageously be applied in this context because the control bit values can be expected to be stable for long periods of time, so they do not have to switch at the most advanced clock rates, which otherwise would only have been feasible with the strongly speed-optimized FEOL devices.

While the disclosed technology has been illustrated and described in detail in the drawings and foregoing description, such illustration and description are to be considered illustrative or exemplary and not restrictive. The foregoing description details certain embodiments of the disclosed technology. It will be appreciated, however, that no matter how detailed the foregoing appears in text, the disclosed technology may be practiced in many ways. The present innovations are not limited to the disclosed embodiments.

Other variations to the disclosed embodiments can be understood and effected by those skilled in the art in practicing such technology, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A control plane for controlling transfer of data to a data plane, the control plane comprising:

a number n of at least two memory cells for each storing a digitally coded parameter value, each memory cell ($D_j$) having a data input electrode, a data output electrode and a control electrode, wherein n is a natural number, n≥2, and j is a natural number;

n data input terminals for each receiving a data input value and applying the data input value to the data input electrode of an associated memory cell ($D_j$) among the memory cells to which the data input terminals are coupled, and n data output terminals, each coupled to a data output electrode of an associated memory cell ($D_j$), wherein the control plane furthermore comprises a first delay line comprising n or n−1 first delay elements, the first delay line being arranged for receiving a stream of control bit values, each first delay element controlling, based on a respective current control bit value in the stream of control bit values, by means of an access control device, the transfer of data received by a memory cell (Dj) via an associated data input electrode to an associated data output electrode, thereby combining the data input value with the digitally coded parameter value stored in the memory cell ($D_j$), and a second delay line comprising n or n−1 second delay elements, the second delay line being arranged for receiving an enabling signal for enabling the control bit values of the stream of control bit values in the first delay line to be passed to the control electrode of an associated memory cell ($D_j$) such that, when a data input value appears at the data input electrode of the memory cell (Dj), the data input value is conditionally transferred in a controlled and synchronized fashion to the associated data output electrode, depending on the stream of control bit values and the enabling signal.

2. The control plane according to claim 1, wherein each corresponding element of the first delay line and the second delay line have a pairwise matched delay.

3. The control plane according to claim 1, wherein the first delay line has a first delay, and the second delay line has a second delay, matched to a fixed ratio, the value of the second delay being substantially twice the value of the first delay.

4. The control plane according to claim 1, wherein the memory cells (Dj) are implemented as thin film transistor (TFT) devices.

5. The control plane according to claim 1, wherein the at least two data output terminals are connected to a common node, the at least two data output terminals each receiving a combination of the value stored in the memory cell (Dj) and the data input value ($\alpha j$) applied to this memory cell, wherein $\alpha j$ is a real number representing a voltage or a current.

6. The control plane according to claim 1, further comprising an output wire for delivering to an output node a sum of products of values stored in the memory cells ($D_j$) and data input values ($\alpha_i$) applied to the corresponding memory cell ($D_j$) wherein $\alpha_i$ is a real number representing a voltage or a current and i is a natural number.

7. The control plane according to claim 1, wherein the synchronization in the first and/or second delay lines is achieved by means of a global clock signal.

8. The control plane according to claim 1, wherein the first and/or second delay lines includes a wave pipeline sequentially steered shared control line for taking care of synchronization between both.

9. The control plane according to claim 1, wherein the memory cells ($D_j$) comprise low-leakage devices.

10. The control plane according to claim 9, wherein the memory cells ($D_j$) are implemented as TFT devices in the back-end-of-line (BEOL).

11. The control plane according to claim 10, wherein the storing of the digitally coded parameter value is done by any of: weighted geometrical coding, current scaling, transistor threshold voltage scaling or accumulation period scaling.

12. The control plane according to claim 1, wherein the memory cells ($D_j$) are implemented in 3D BEOL stacking technology.

13. The control plane according to claim 1, wherein the enabling signal has a single pulse.

14. A neural network or neuromorphic computing platform making use of a control plane for controlling transfer of data to a data plane, the control plane comprising:

a number n of at least two memory cells for each storing a digitally coded parameter value, each memory cell ($D_j$) having a data input electrode, a data output electrode and a control electrode, wherein n is a natural number, n≥2, and j is a natural number;

n data input terminals for each receiving a data input value and applying the data input value to the data input electrode of an associated memory cell ($D_j$) among the memory cells to which the data input terminals are coupled, and n data output terminals, each coupled to a data output electrode of an associated memory cell ($D_j$), wherein the control plane furthermore comprises a first delay line comprising n or n−1 first delay elements, the first delay line being arranged for receiving a stream of control bit values, each first delay element controlling, based on a respective current control bit value in the stream of control bit values, by means of an access control device, the transfer of data received by a memory cell (Dj) via an associated data input electrode to an associated data output electrode, thereby combining the data input value with the digitally coded parameter value stored in the memory cell ($D_j$), and a second delay line comprising n or n−1 second delay elements, the second delay line being arranged for receiving an enabling signal for enabling the control bit values of the stream of control bit values in the first delay line to be passed to the control electrode of an associated memory cell ($D_j$) such that, when a data input value appears at the data input electrode of the memory cell (Dj), the data input value is conditionally transferred in a controlled and synchronized fashion to the associated data output electrode, depending on the stream of control bit values and the enabling signal.

15. A method for machine learning making use of a control plane for controlling transfer of data to a data plane, the control plane comprising:

a number n of at least two memory cells for each storing a digitally coded parameter value, each memory cell ($D_j$) having a data input electrode, a data output electrode and a control electrode, wherein n is a natural number, n≥2, and j is a natural number;

n data input terminals for each receiving a data input value and applying the data input value to the data input electrode of an associated memory cell ($D_j$) among the memory cells to which the data input terminals are coupled, and n data output terminals, each coupled to a data output electrode of an associated memory cell ($D_j$), wherein the control plane furthermore comprises a first delay line comprising n or n−1 first delay elements, the first delay line being arranged for receiving a stream of control bit values, each first delay element controlling, based on a respective current control bit value in the stream of control bit values, by means of an access control device, the transfer of data received by a memory cell (Dj) via an associated data input electrode to an associated data output electrode, thereby combining the data input value with the digitally coded parameter value stored in the memory cell ($D_j$), and a second delay line comprising n or n−1 second delay elements, the second delay line being arranged for receiving an enabling signal for enabling the control bit values of the stream of control bit values in the first delay line to be passed to the control electrode of an associated memory cell ($D_j$) such that, when a data input value appears at the data input electrode of the memory cell (Dj), the data input value is conditionally transferred in a controlled and synchronized fashion to the associated data output electrode, depending on the stream of control bit values and the enabling signal.

16. The control plane according to claim 2, wherein the first delay line has a first delay, and the second delay line has a second delay, matched to a fixed ratio, the value of the second delay being substantially twice the value of the first delay.

17. The control plane according to claim 16, wherein the memory cells (Dj) are implemented as TFT devices.

18. The control plane according to claim 16, wherein the at least two data output terminals are connected to a common node, the at least two data output terminals each receiving a combination of the value stored in the memory cell (Dj) and the data input value ($\alpha j$) applied to this memory cell, wherein $\alpha j$ is a real number representing a voltage or a current.

19. The control plane according to claim 18, further comprising an output wire for delivering to an output node a sum of products of values stored in the memory cells ($D_j$) and data input values ($\alpha_i$) applied to the corresponding memory cell ($D_j$) wherein $\alpha_i$ is a real number representing a voltage or a current and i is a natural number.

20. The control plane according to claim 19, wherein the synchronization in the first and/or second delay lines is achieved by means of a global clock signal.

* * * * *

UNITED STATES PATENT AND TRADEMARK OFFICE
CERTIFICATE OF CORRECTION

PATENT NO. : 10,802,743 B2  
APPLICATION NO. : 16/028328  
DATED : October 13, 2020  
INVENTOR(S) : Francky Catthoor et al.

Page 1 of 1

It is certified that error appears in the above-identified patent and that said Letters Patent is hereby corrected as shown below:

In the Specification

In Column 12, Line 43, delete "tend," and insert -- $i_{end}$, --.

In Column 15, Line 5, delete "Å" and insert -- A --.

In the Claims

In Column 19, Line 37, Claim 6, delete "(D$_j$)" and insert -- (D$_j$), --.

In Column 21, Line 19, Claim 19, delete "(D$_j$)" and insert -- (D$_j$), --.

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*